(12) United States Patent
Mizokami

(10) Patent No.: US 9,602,065 B2
(45) Date of Patent: Mar. 21, 2017

(54) SEMICONDUCTOR DEVICE

(71) Applicant: RENESAS ELECTRONICS CORPORATION, Tokyo (JP)

(72) Inventor: Masakazu Mizokami, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/847,981

(22) Filed: Sep. 8, 2015

(65) Prior Publication Data
US 2016/0072443 A1 Mar. 10, 2016

(30) Foreign Application Priority Data

Sep. 9, 2014 (JP) ................. 2014-183302

(51) Int. Cl.
*H04M 1/00* (2006.01)
*H03F 3/19* (2006.01)
*H03F 1/56* (2006.01)
*H03F 3/21* (2006.01)
*H03F 3/45* (2006.01)
*H03F 3/72* (2006.01)

(52) U.S. Cl.
CPC ............ *H03F 3/19* (2013.01); *H03F 1/565* (2013.01); *H03F 3/211* (2013.01); *H03F 3/45188* (2013.01); *H03F 3/72* (2013.01); *H03F 2200/111* (2013.01); *H03F 2200/294* (2013.01); *H03F 2200/429* (2013.01); *H03F 2200/451* (2013.01); *H03F 2200/537* (2013.01); *H03F 2203/21109* (2013.01); *H03F 2203/21112* (2013.01); *H03F 2203/7209* (2013.01)

(58) Field of Classification Search
CPC ............... H03F 1/565; H03F 2200/111; H03F 2200/294; H03F 2200/429; H03F 2200/451; H03F 2200/537; H03F 2203/21109; H03F 2203/21112; H03F 2203/7209; H03F 3/19; H03F 3/211; H03F 3/45188; H03F 3/72
USPC ... 455/552.1, 13.4, 323, 298, 334, 133, 341, 455/296; 330/192, 311, 305, 291, 254, 330/196; 327/355, 356; 336/200, 232; 375/258; 257/531; 363/21.02
See application file for complete search history.

(56) References Cited

U.S. PATENT DOCUMENTS

| | | | |
|---|---|---|---|
| 8,019,314 B2 | 9/2011 | Tomiyama | |
| 8,232,857 B1* | 7/2012 | Wright | H01F 19/08 336/182 |
| 8,493,126 B2* | 7/2013 | Sankaranarayanan | H03H 7/422 327/355 |

(Continued)

FOREIGN PATENT DOCUMENTS

JP     2009-10461 A     1/2009

*Primary Examiner* — Tan H Trinh
(74) *Attorney, Agent, or Firm* — McDermott Will & Emery LLP

(57) ABSTRACT

In a semiconductor device, received signals of different frequency bands are input selectively to low noise amplifiers. A plurality of primary inductors are coupled between differential output nodes of the respective low noise amplifiers. A secondary inductor is provided commonly for the primary inductors, and magnetically coupled to the primary inductors. A demodulator converts a received signal transmitted from one of the primary inductors to the secondary inductor by electromagnetic induction, into a signal of a low frequency.

15 Claims, 14 Drawing Sheets

(56) References Cited

U.S. PATENT DOCUMENTS

| | | | | |
|---|---|---|---|---|
| 8,665,033 B2* | 3/2014 | Tang | H03B 5/1228 | 331/117 FE |
| 8,742,880 B2* | 6/2014 | Kim | H03B 5/1228 | 336/200 |
| 8,989,691 B2* | 3/2015 | Choksi | H04B 1/18 | 375/258 |
| 9,479,199 B2* | 10/2016 | Koroglu | H04B 1/005 | |
| 2004/0130916 A1* | 7/2004 | Baarman | A61L 2/10 | 363/21.02 |
| 2005/0140456 A1* | 6/2005 | Krishnasamy Maniam | H03F 1/22 | 330/311 |
| 2005/0231290 A1* | 10/2005 | Hung | H03F 1/223 | 330/311 |
| 2008/0136528 A1* | 6/2008 | Sjoland | H03F 3/195 | 330/301 |
| 2009/0096532 A1* | 4/2009 | El Rai | H03F 3/195 | 330/301 |
| 2009/0153244 A1* | 6/2009 | Cabanillas | H03F 1/3205 | 330/253 |
| 2009/0195310 A1* | 8/2009 | Holenstein | H03F 1/3205 | 330/254 |
| 2010/0148869 A1* | 6/2010 | Kawakami | H03F 1/56 | 330/255 |
| 2010/0328546 A1* | 12/2010 | Rafi | H03J 3/06 | 348/731 |
| 2011/0063028 A1* | 3/2011 | Kawakami | H03F 3/19 | 330/252 |
| 2011/0210792 A1* | 9/2011 | Kawakami | H03F 3/195 | 330/253 |
| 2011/0299634 A1* | 12/2011 | Mirzaei | H03F 3/45179 | 375/340 |
| 2012/0056297 A1* | 3/2012 | Akhtar | H01L 23/5227 | 257/531 |
| 2012/0231729 A1* | 9/2012 | Xu | G01S 19/21 | 455/13.4 |
| 2013/0057346 A1* | 3/2013 | Riekki | H03F 1/0277 | 330/254 |
| 2013/0057350 A1* | 3/2013 | Riekki | H03F 1/56 | 330/291 |
| 2013/0106553 A1* | 5/2013 | Kim | H03B 5/1228 | 336/200 |
| 2013/0281041 A1* | 10/2013 | Choksi | H04B 1/18 | 455/298 |
| 2013/0281043 A1* | 10/2013 | Mu | H03F 1/223 | 455/311 |
| 2013/0316671 A1* | 11/2013 | Stockinger | H04B 1/18 | 455/341 |
| 2014/0062591 A1* | 3/2014 | Manetakis | H03F 3/21 | 330/196 |
| 2014/0070884 A1* | 3/2014 | Gramegna | H03F 1/565 | 330/144 |
| 2015/0116037 A1* | 4/2015 | Kanemaru | H03F 1/565 | 330/282 |
| 2015/0194944 A1* | 7/2015 | Joshi | H04B 1/0458 | 327/551 |
| 2015/0295594 A1* | 10/2015 | Kehrer | H04B 1/1027 | 375/316 |
| 2015/0349722 A1* | 12/2015 | Wang | H03F 1/26 | 330/295 |
| 2016/0036392 A1* | 2/2016 | Bohsali | H03F 1/26 | 375/340 |

* cited by examiner

SEMICONDUCTOR DEVICE

CROSS-REFERENCE TO RELATED APPLICATIONS

The disclosure of Japanese Patent Application No. 2014-183302 filed on Sep. 9, 2014 including the specification, drawings and abstract is incorporated herein by reference in its entirety.

TECHNICAL FIELD

The present invention relates to a semiconductor device, and preferably used for a semiconductor device including a high frequency receiving unit for wireless communication, such as a cellular phone.

BACKGROUND

Recently, it is demanded that wireless communication terminals, such as cellular phones, correspond to a plurality of communication standards. Multimode high frequency integrated circuits (RFIC: Radio Frequency Integrated Circuits) have been developed. The multimode RFICs correspond, for example, to GSM (registered trademark) (Global System for Mobile Communications), EDGE (Enhanced Data Rates for GSM Evolution), WCDMA (registered trademark) (Wideband Code Division Multiple Access), and LTE (registered trademark) (Long Term Evolution).

In the multimode RFIC, it is necessary to mount a circuit corresponding to an RF signal of a plurality of frequency bands. This causes a problem of increasing the circuit area. If it is intended to correspond to reception carrier aggregation and reception diversity, reception paths of a plurality of systems are necessary, thus causing another serious problem of increasing the circuit area.

A technique disclosed in Japanese Unexamined Patent Publication No. 2009-10461 is known as a method for reducing the circuit area of the RFIC. According to the technique of this literature, an inductor for degeneration and a load inductor are shared between a plurality of low noise amplifiers (LNA) corresponding respectively to a plurality of reception frequency bands.

However, as the number of LNAs sharing the load inductor increases, the effect of the parasitic capacitance accompanying with an output side of the LNAs increases. A problem is that the gain of the LNAs and the noise characteristic decrease, due to an effect of the parasitic capacitance. Thus, in the related art, the number of LNAs sharing the load inductor is limited. Therefore, the circuit area is hardly reduced.

Other objects and new features will be apparent from the descriptions of the present specification and accompanying drawings.

SUMMARY

A semiconductor device according to an embodiment includes a plurality of primary inductors coupled between differential output nodes of each of the low noise amplifiers, and a secondary inductor provided commonly for the primary inductors and magnetically coupled to each of the primary inductors.

According to an embodiment of the present invention, it is possible to reduce the area of the reception circuit.

DESCRIPTION OF THE PREFERRED EMBODIMENTS

Figure 1:
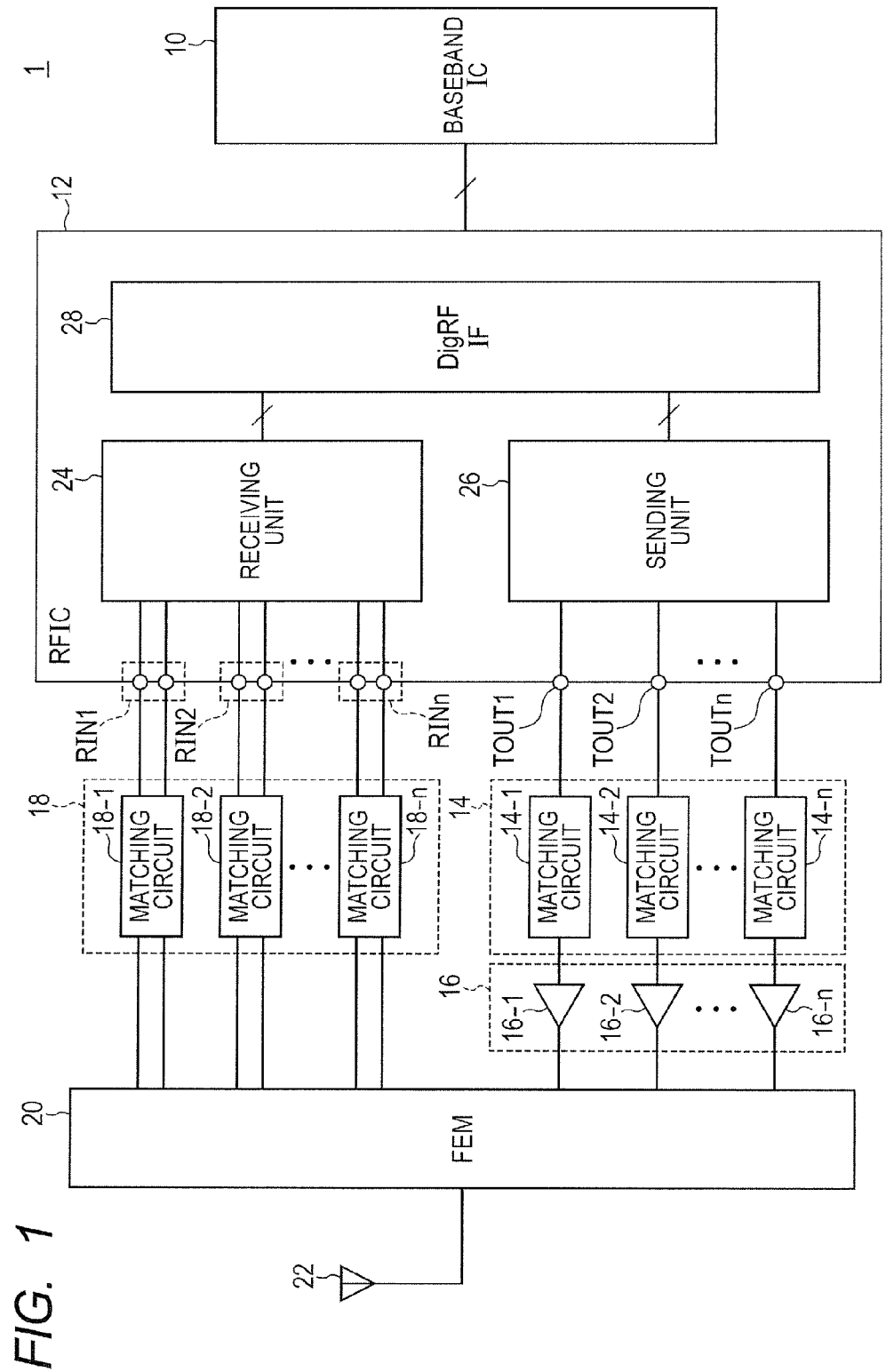
FIG. 1 is a block diagram illustrating a configuration of a wireless communication terminal in which an RFIC according to a first embodiment is mounted.

Descriptions will now specifically be made to embodiments with reference to the accompanying drawings. The same and corresponding elements are identified with the same reference numerals, and thus will not repeatedly be described.

<First Embodiment> [Schematic Configuration of Wireless Communication System]

FIG. 1 is a block diagram illustrating a wireless communication terminal in which an RFIC according to the first embodiment is built. The wireless communication terminal 1 of FIG. 1 is used for cellular phones, for example. The wireless communication system 1 includes an RFIC 12, a baseband IC (Integrated Circuit) 10, an HPA (High Power Amplifier) module 16, transmission matching circuits 14_1 to 14_n, reception matching circuits 18_1 to 18_n, a front-end module (FEM) 20, and an antenna 22.

(RFIC)

As illustrated in FIG. 1, the RFIC 12 as a semiconductor device includes a receiving unit 24, a sending unit 26, and a digital RF (Radio Frequency) interface (DigRF IF) 28.

The receiving unit 24 converts (down-converts) a received RF signal received by the antenna 22 from a base station, into an analog received baseband signal of a low frequency, using a local carrier signal (local oscillation signal). Further, the receiving unit 24 AD (Analog-to-Digital)-converts the analog received baseband signal to generate a digital received baseband signal.

The sending unit 26 DA (Digital-to-Analog)-converts a digital transmission baseband signal to generate an analog transmission baseband signal. The sending unit 26 further converts (up-converts) the analog transmission baseband signal into a transmission RF signal of a higher frequency, using a local carrier signal. The sending unit 26 wirelessly sends the transmission RF signal to the base station through the antenna 22.

The digital RF interface 28 is an interface provided between the RFIC 12 and the baseband IC 10, and based on an interface standard established by the MIPI Alliance (Mobile Industry Processor Interface).

The RFIC 12 further includes a plurality of output ports TOUT1 to TOUTn respectively outputting RF signals and a plurality of input ports RIN1 to RINn respectively receiving RF signals. Each of the input ports RINs includes a positive-side terminal and a negative-side terminal. To this pair of terminals, a differential received RF signal is input. Each of the output ports TOUT includes an output terminal for outputting a single-end transmission RF signal. The output ports TOUTs and the input ports RIN are formed respectively in pair, like (TOUT1, RIN1), . . . , (TOUTn, RINn). The pair of output port and the input port to be used are determined in accordance with the band (frequency band) used by the RFIC.

(Baseband IC)

The baseband IC 10 performs digital demodulation and other signal processes for the digital received baseband signal received by the RFIC 12, to generate received data (voice, image, or another data). The baseband IC 10 performs digital demodulation and other signal processes for transmission data (voice, image, or another data), to generate a digital transmission baseband signal, and transfers it to the RFIC 12. Though not illustrated in FIG. 1, the cellular phone having the wireless communication system 1 mounted therein includes an application processor, a memory, a speaker, a microphone, input keys, and a liquid crystal monitor. Each of these units sends/receives signals to/from the baseband IC 10.

(HPA Module)

The HPA module 16 includes a plurality of HPA (High Power Amplifier) 16_1 to 16_n corresponding respectively to the output ports TOUT1 to TOUTn. Each of the HPAs amplifies a transmission RF signal received from a corresponding output port through the matching circuit. Each of the HPAs includes one semiconductor chip, and is modularized in the package.

(Front-End Module)

The front-end module 20 couples between a pair of input/output ports (RINi, TOUTi) ("i" is an integer equal to or greater than 1), selected from pairs of the input/output ports RIN1, TOUT1) to (RINn, TOUTn), and the antenna 22.

(Matching Circuit)

The transmission matching circuits 14_1 to 14_n are inserted respectively between the output ports TOUT1 to TOUTn and the plurality of HPA 16_1 to 16_n. Each of the transmission matching circuits matches between an output impedance of the sending unit 26 and an input impedance of the HPA. In FIG. 1, the matching circuits 14_1 to 14_n are externally mounted from the RFIC 12, but may possibly be built inside the RFIC 12.

The reception matching circuits 18_1 to 18_n are inserted between the input ports RIN1 to RINn and the front-end module 20. Each of the reception matching circuits matches between an output impedance of the front-end module 20 and an input impedance of the receiving unit 24. In FIG. 1, the matching circuits 18_1 to 18_n are externally mounted from the RFIC 12, but may possibly be built inside the RFIC 12.

[Detailed Configuration of Front-End Module]

Figure 2:
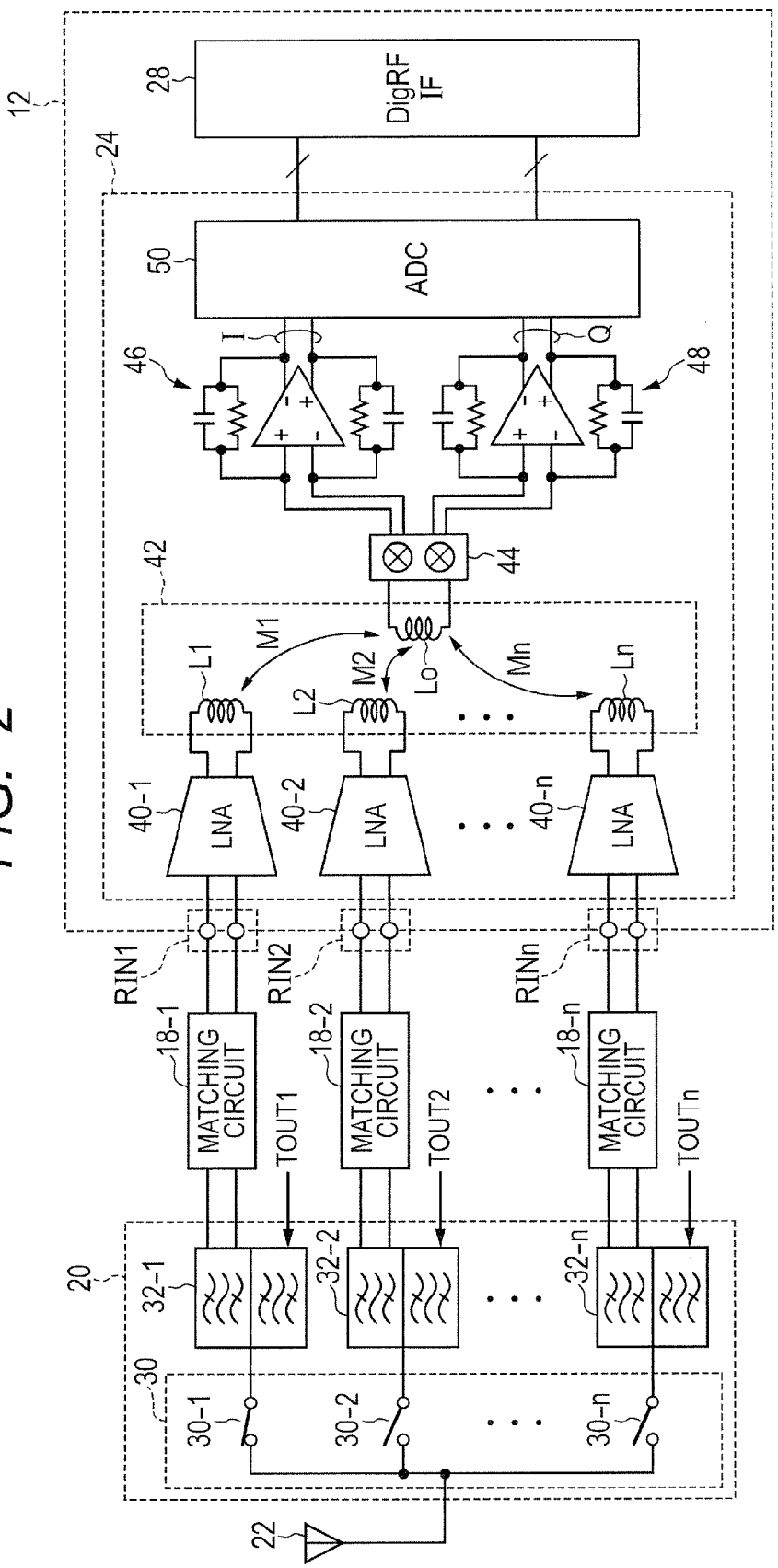
FIG. 2 is a diagram illustrating a detailed configuration of a front-end module and a receiving unit of FIG. 1.

FIG. 2 is a diagram illustrating a detailed configuration of the front-end module and the receiving unit of FIG. 1.

With reference to FIG. 2, the front-end module 20 includes RF switches 30_1 to 30_n and duplexers 32_1 to 32_n. The RF switches 30_1 to 30_n selectively switch the coupling between the antenna 22 and the n-number of duplexers 32_1 to 32_n.

The duplexers 32_1 to 32_n are provided to correspond to the pairs of the input/output ports (RINi, TOUTi) ("i" is an integer between 1 and n). Each of the duplexers includes a bandpass filter which passes a transmission RF signal output from the corresponding output port TOUT and a bandpass filter which passes a received RF signal to be supplied to a corresponding input port RIN, of signals received by the antenna 22. The reception bandpass filter included in each of the duplexers 32 outputs a differential received RF signal to a corresponding matching circuit 18 for a frequency band.

[Detailed Configuration of Receiving Unit]

With reference to FIG. 2, the receiving unit 24 includes n-number of LNAs (low noise amplifiers) 40_1 to 40_n, an n-input 1-output transformer 42, a quadrature demodulator 44, active filters 46 and 48, and an AD converter (ADC: Analog to Digital Converter) 50.

Each of the LNAs 40 is a fully-differential amplifier which amplifies a corresponding differential RF signal in a frequency band and input from the corresponding input port RIN, and outputs the amplified differential RF signal.

The transformer 42 includes n-number of primary inductors L1 to Ln and one secondary inductor Lo magnetically coupled to the primary inductors. The primary inductors L1 to Ln respectively correspond to the LNAs 40_1 to 40_n, and are coupled between the differential output nodes of their corresponding LNAs. A signal input to either one of the primary inductors L1 to Ln is transmitted to the secondary inductor Lo by electromagnetic induction.

The quadrature demodulator 44 includes first and second mixers, a non-illustrative local oscillator, and a non-illustrative 1/2 frequency divider. The 1/2 frequency divider generates first and second local oscillation signals having phases different from each other by 90 degrees, from the signal output from the local oscillator. The first mixer mixes the signal from the second inductor Lo with the first local oscillation signal. Similarly, the second mixer mixes the signal from the secondary inductor Lo with the second local oscillation signal.

The active filter 46 removes a high frequency component of the output signal of the first mixer. This results in generating an I signal (in-phase signal) as an analog received baseband signal. Similarly, the active filter 48 removes a high frequency component of the output signal of the second mixer. This results in generating a Q signal (quadrature signal) as an analog received baseband signal. The I signal and the Q signal are input to the ADC 50, thereby being converted into digital signals.

The above descriptions have been made to the case in which the receiving unit 24 is a direct conversion system. However, the receiving unit 24 may possibly be configured with a superheterodyne system.

[Detailed Configuration of Transformer]

Figure 3:
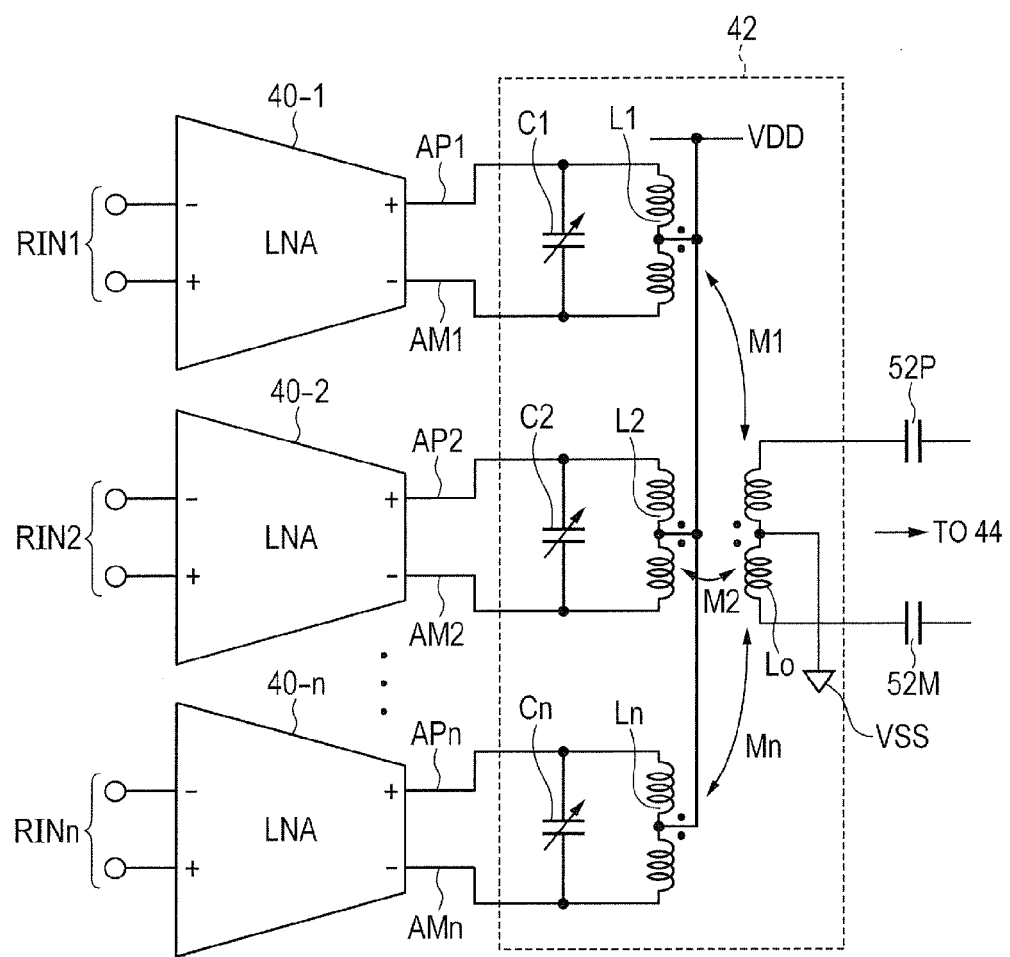
FIG. 3 is a circuit diagram illustrating a detailed configuration of a transformer 42 of FIG. 2.

FIG. 3 is a circuit diagram illustrating a detailed configuration of the transformer 42 of FIG. 2. With reference to FIG. 3, the transformer 42 further includes variable capacitance elements C1 to Cn parallelly coupled respectively to the primary inductors L1 to Ln. As will be described later, a parallel resonance circuit is configured with each of the variable capacitance elements together with a corresponding primary inductor, at a frequency of the received RF signal.

The middle points of the primary inductors L1 to Ln are coupled to nodes (hereinafter referred to also as source nodes VDD) providing a source voltage VDD. Both ends of the secondary inductor Lo are coupled to the quadrature demodulator 44. Capacitance elements 52P and 52M are coupled between the secondary inductor Lo and the quadrature demodulator 44. Further, the middle point of the secondary inductor Lo is coupled to a node (hereinafter referred to also as a ground node VSS) providing a ground potential VSS.

The capacitance elements 52P and 52M are provided to set the potential of the secondary inductor Lo regardless of the bias voltage of the quadrature demodulator 44, but may not be necessary depending on the circuit configuration of the quadrature demodulator 44. In the case of FIG. 3, the middle point of the secondary inductor Lo may be coupled to the source node VDD.

Of the LNAs 40_1 to 40_n, one LNA is selectively activated in accordance with the frequency band of the received RF signal, while the rest of the LNAs are inactivated. Controlling of the activation/inactivation of the LNAs is executed by the digital RF interface 28 or the baseband IC 10 (both are generally referred to as a control unit). The LNA in an activation state amplifies an input signal, while the LNAs in an inactivation state interrupt the input signal.

When a corresponding LNA is in an activation state, each of the variable capacitance elements is adjusted to form the parallel resonance circuit together with a corresponding primary inductor at a frequency of the received RF signal. This enables to increase the intensity of the RF current signal transmitted to the secondary inductor Lo. When a corresponding LNA is in an inactivation state, each of the variable capacitance elements is set to the possible minimum capacitance value.

[Configuration Example of LNA]

Figure 4:
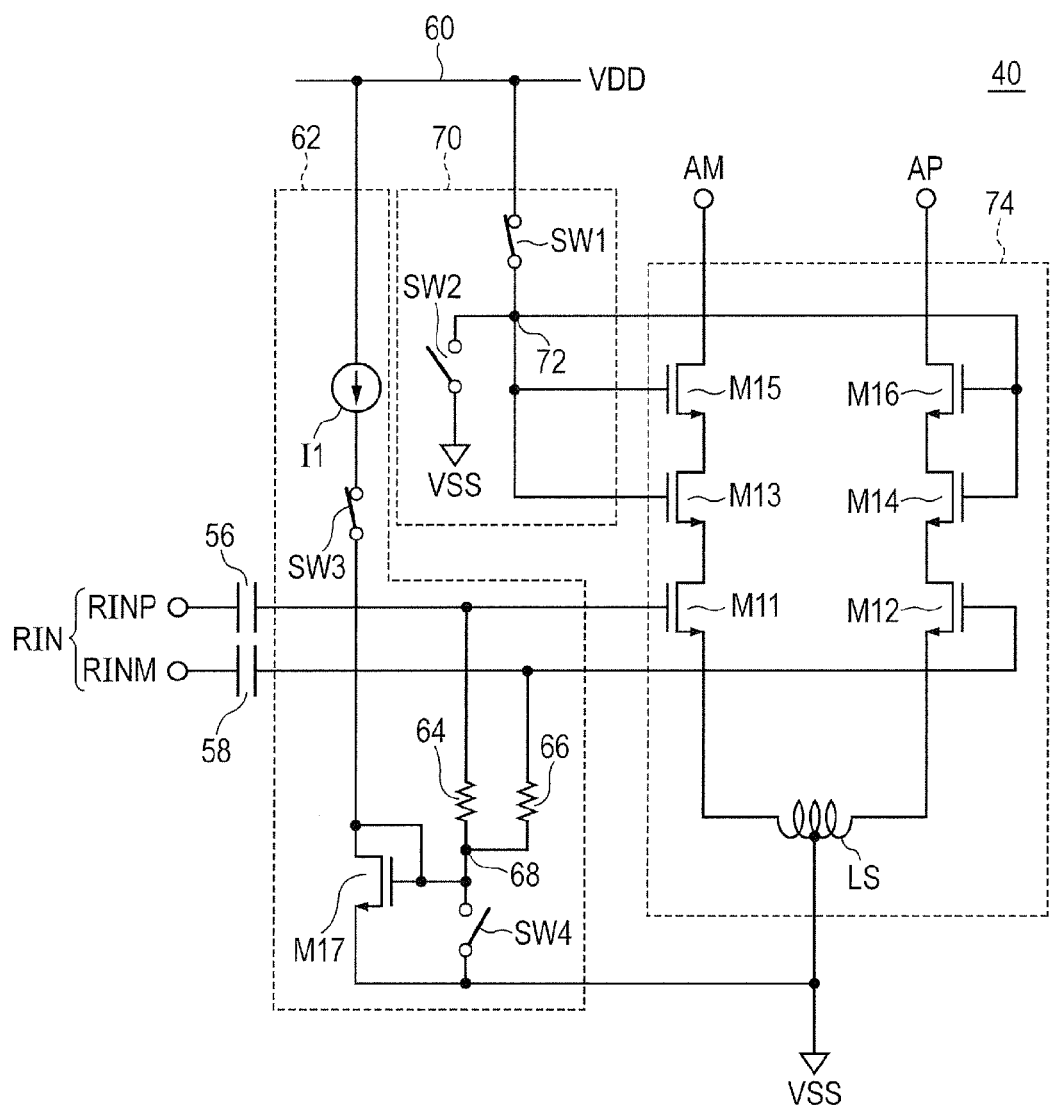
FIG. 4 is a circuit diagram illustrating a configuration example of LNAs illustrated in FIG. 2 and FIG. 3.

FIG. 4 is a circuit diagram illustrating a configuration example of the LNA illustrated in FIG. 2 and FIG. 3. With reference to FIG. 4, an LNA 40 includes a cascode differential amplifier circuit 74, first and second bias setting circuits 62 and 70, capacitance elements 56 and 58, a positive-side output node AP, and a negative-side output node AM.

The cascode differential amplifier circuit 74 includes NMOS (N-channel Metal Oxide Semiconductor) transistors M11 to M16 and an inductor LS for degeneration. The NMOS transistors M11 and M12 form a differential pair, and their gates are coupled to the input ports RIN (positive-side terminal RINP, negative-side terminal RINM) through the capacitance elements 56 and 58. The NMOS transistors M13 and M15 are coupled in series between the drain and the output node AM of the NMOS transistor M11, in this order. Similarly, the NMOS transistor M14 and 16 are coupled in series between the drain and the output node AP of the NMOS transistor M12, in this order. A corresponding primary inductor and the variable capacitance elements are coupled between the output nodes AP and AM. The inductor LS is coupled between the sources of the NMOS transistors M11 and M12. The middle point of the inductor LS is coupled to the ground node VSS.

The bias setting circuit 62 includes a current source 11, switch elements SW3 and SW4 as MOS transistors, a diode-coupled NMOS transistor M17, and resistance elements 64 and 66. The current source 11, the switch element SW3, and the NMOS transistor M17 are coupled in series between a power line 60 (to which a power potential VDD is given) and the ground node VSS, in this order. The gate of the NMOS transistor M17 is coupled to the gate of the NMOS transistor M11 through the resistance element 64, and coupled to the gate of the NMOS transistor M12 through the resistance element 66. The gate of the NMOS transistor M12 is coupled to the ground node VSS through the switch element SW4.

The bias setting circuit 70 includes switch elements SW1 and SW2 as MOS transistors. The switch elements SW1 and SW2 are coupled in series between the power line 60 and the ground node VSS, in this order. A coupled node 72 of the switch elements SW1 and SW2 is coupled to each gate of the NMOS transistors M13 to M16.

In the above configuration, opening/closing of the switch elements SW1 to SW4 and the capacitance value of a corresponding variable capacitance element of FIG. 3 are controlled in accordance with a control signal from the digital RF interface 28 or the baseband IC 10. The LNA 40 is activated by controlling the switch elements SW1 and SW3 to an ON state and by controlling the switch elements SW2 and SW4 to an OFF state. On the contrary, the LNA 40 is inactivated by controlling the switch elements SW1 and SW3 to an OFF state and by controlling the switch elements SW2 and SW4 to an ON state.

When the LNA 40 is in the activation state, the NMOS transistors M11 and M12 operate as a source ground amplifier circuit, while the NMOS transistors M13 to M16 operate as a gate ground amplifier circuit. Specifically, the NMOS transistors M11 and M12 convert a differential RF voltage signal input from the input port RIN into a current signal while amplifying the signal. The amplified differential RF current signal is transmitted by the NMOS transistors M13 to M16, and output to a corresponding primary inductor of the transformer 42 from the output nodes AP and AM. Electromagnetic induction is generated upon flowing of the RF current signal to the corresponding primary inductor, and the RF current signal is transmitted to the secondary inductor Lo which is magnetically coupled to the primary inductor.

As described above, when the LNA 40 is in the activation state, the capacitance value of a corresponding variable capacitance element is adjusted, in a manner that the parallel resonance circuit is configured with the corresponding variable capacitance element and the primary inductor. As a result, it is possible to increase the amplitude of the RF current signal transmitted for the secondary inductor Lo.

When the LNA 40 is in the inactivation state, a ground potential is input to the gates of the NMOS transistors M11 to M16. Thus, these NMOS transistors M11 to M16 are in an OFF state. As a result, the LNA 40 cannot execute a signal amplifying operation.

[Configuration Example of Mixer and Active Filter]

Figure 5:
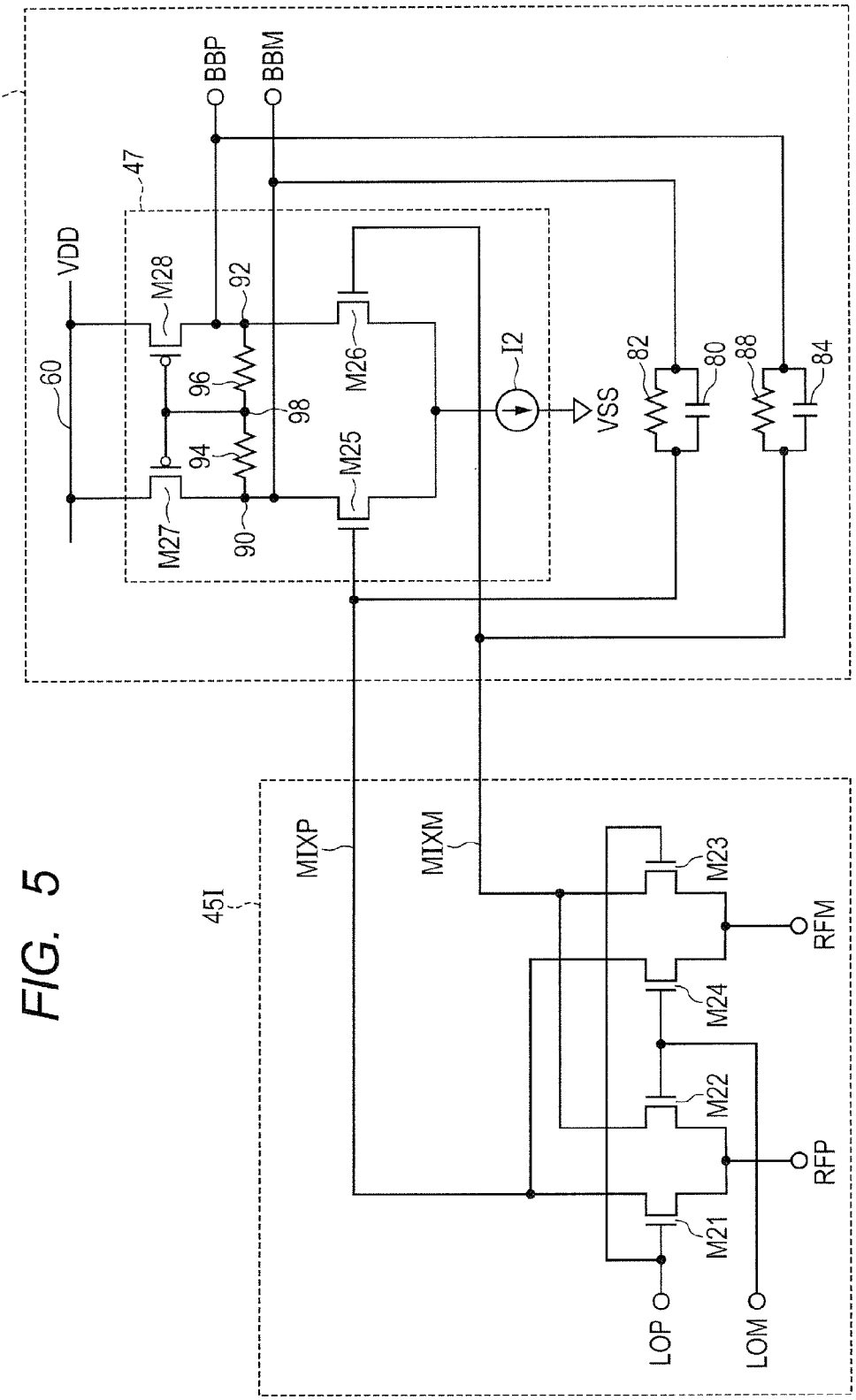
FIG. 5 is a circuit diagram illustrating a configuration example of a mixer and an active filter included in a quadrature demodulator illustrated in FIG. 2.

FIG. 5 is a circuit diagram illustrating a configuration example of the mixer and the active filter included in the quadrature demodulator illustrated in FIG. 2. FIG. 5 illustrates a configuration of a mixer 451 and an active filter 46, on the I-signal side. The same configuration is applied to that of the mixer and the active filter 48, on the Q-signal side.

With reference to FIG. 5, the mixer 451 is a modification of so-called a Gilbert Cell mixer. Specifically, the mixer 451 includes differential input nodes RFP and RFM, differential input nodes LOP and LOM, differential output nodes MIXP and MIXM, and NMOS transistors M21 to M24. The differential input nodes RFP and RFM are coupled to the secondary inductor of the transformer 42, to receive a differential RF current signal input thereto. The differential input nodes LOP and LOM receive a differential local oscillation signal input thereto.

The NMOS transistors M21 and M22 form a differential pair. The sources of the NMOS transistors M21 and M22 are coupled to the input node RFP on the positive electrode side. As a result, an RF current signal of the positive electrode side is commonly input thereto. The gates of the NMOS transistors M21 and M22 are coupled respectively to the differential input nodes LOP and LOM. As a result, a differential local oscillation signal is input thereto. The amplitude of the local oscillation signals is relatively enlarged, thus causing the NMOS transistors M21 and M22 to function as switches to be complementarily ON and OFF. The drains of the NMOS transistors M21 and M22 are coupled respectively to the differential output nodes MIXP and MIXM.

Similarly, the NMOS transistors M23 and M24 form a differential pair. The sources of the NMOS transistors M23 and M24 are coupled to the input node RFM on the negative electrode side. As a result, an RF current signal of the negative electrode side is commonly input thereto. The gates of the NMOS transistors M23 and M24 are coupled respectively to the differential input nodes LOP and LOM. As a result, a differential local oscillation signal is input thereto. The amplitude of the local oscillation signal is relatively enlarged, thus causing the NMOS transistors M23 and M24 to function as switches to be complementarily ON and OFF. The drains of the NMOS transistors M23 and M24 are coupled respectively to the differential output nodes MIXM and MIXP.

According to the above configuration of the mixer 451, the differential output nodes MIXP and MIXM output a current signal which has been obtained by multiplying the differential RF current signal and the differential local oscillation signal.

The active filter 46 includes a differential amplifier circuit 47, capacitance elements 80 and 84, and resistance elements 82 and 88. The differential amplifier circuit 47 includes NMOS transistors M25 and M26, PMOS (P-channel MOS) transistors M27 and M28, resistance elements 94 and 96, a current source 12, and differential output nodes BBP and BBM which output differential signals.

The NNOS transistors M25 and M26 are used as a differential pair. The sources of the NMOS transistors M25 and M26 are coupled to the ground node VSS through the common current source 12. The drains of the NMOS transistors M25 and M26 are coupled to the power line 60 through the PMOS transistors M27 and M28 used as load transistors. The resistance elements 94 and 96 are coupled in series between a drain 90 of the PMOS transistor M27 and a drain of the PMOS transistor M28. A coupling node 98 of the resistance elements 94 and 96 is coupled to the gates of the PMOS transistors M27 and M28. As a result, a bias potential is given to the PMOS transistors.

The output node BBP is coupled to the drain 92 of the PMOS transistor M28, and coupled also to the output node MIXM of the mixer 451 through the parallel circuit of the capacitance element 84 and the resistance element 88. Similarly, the output node BBM is coupled to the drain 90 of the PMOS transistor M27, and coupled also to the output node MIXP of the mixer 451 through the parallel circuit of the capacitance element 80 and the resistance element 82.

The above-described configuration forms a low pass filter in which a differential output voltage of the differential amplifier circuit 47 is negatively fed back to the input side through the parallel circuit of the capacitance element and the resistance element. The cut-off frequency of the low pass filter is determined based on a reciprocal of a square root of the product of the capacitance values of the capacitance elements 80 and 84 and the resistance values of the resistance elements 82 and 88.

[Layout Example of Transformer]

Figure 6:
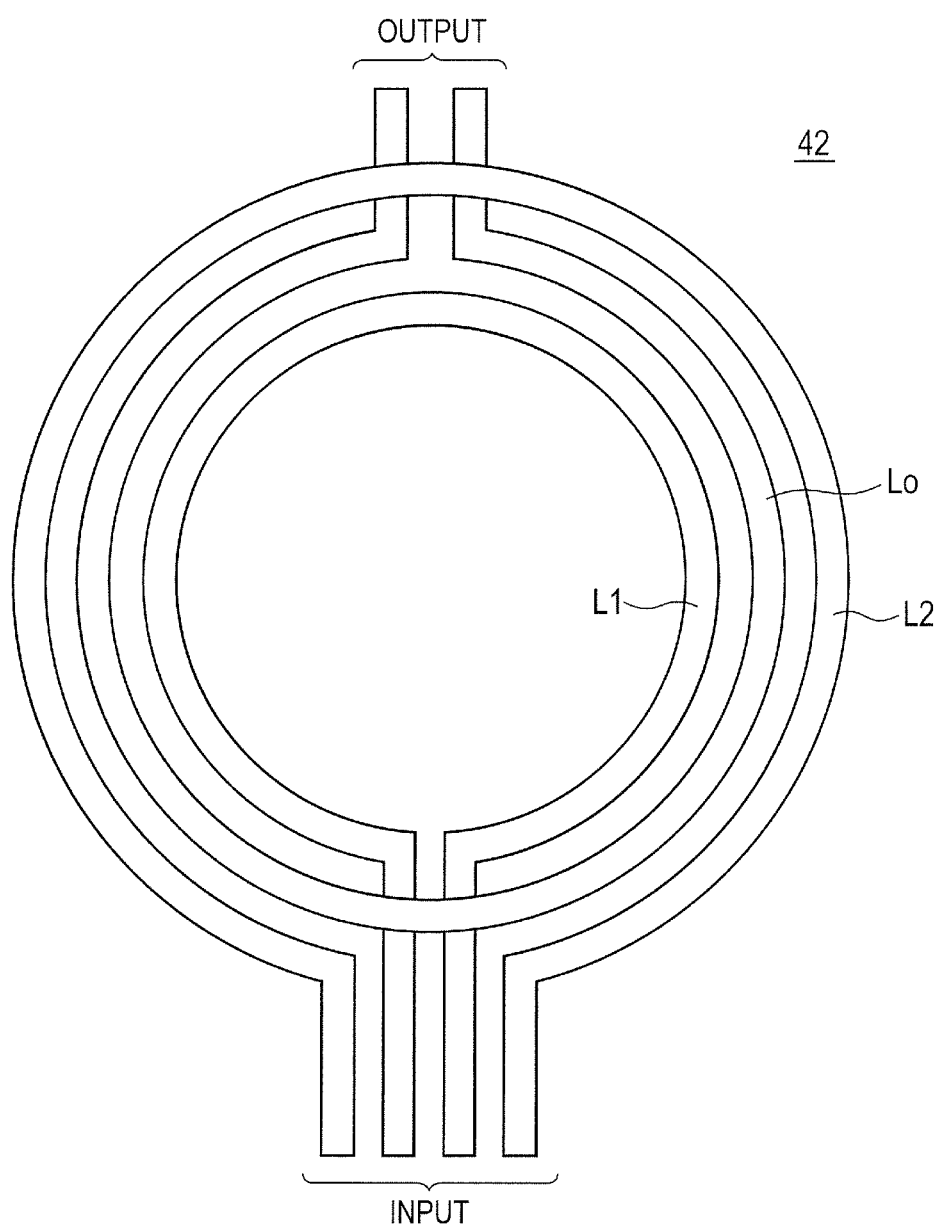
FIG. 6 is a plan view schematically illustrating a layout example of the transformer illustrated in FIG. 2 and FIG. 3.

FIG. 6 is a plan view schematically illustrating a layout example of the transformer illustrated in FIG. 2 and FIG. 3. In the example of FIG. 6, the transformer 42 is configured with two primary inductors L1 and L2 and the secondary inductor Lo. The primary inductor L1 is provided adjacent to the inner circumference side of the secondary inductor Lo, while the primary inductor L2 is provided adjacent to the outer circumference side. In FIG. 6, the number of turns of each inductor is 1. However, it is preferred that the number of turns be a plural number. Another possible configuration is that a plurality of inductors are laminated in a direction vertical to the substrate. In the transformer 42, the plurality of inductors are adjacent to each other or laminated in this manner, thus enabling to realize relatively a small layout area.

[Design of Transformer]

Descriptions will now be made to the design of the transformer 42 illustrated in FIG. 2 and FIG. 3.

As described in FIG. 3, the n-number of variable capacitance elements C1 to Cn are parallelly coupled to the n-number of primary inductors L1 to Ln. The capacitance values of the n-number of variable capacitance elements C1 to Cn can independently be adjusted. Further, the n-number of inductors L1 to Ln are coupled to output nodes (AP1, AM1) to (APn, AMn) of the n-number of LNA 40_1 to 40_n.

When to activate the i-th ($1 \leq i \leq n$) LNA 40_i, the capacitance value of a variable capacitance element Ci is set, in a manner that the parallel resonance circuit is configured with a corresponding primary inductor Li and the variable capacitance element Ci at a frequency of a received RF signal to be input to the LNA 40_i. The capacitance values of other variable capacitance elements C1 to Ci−1 and Ci+1 to Cn are set to the possible minimum values.

Figure 7:
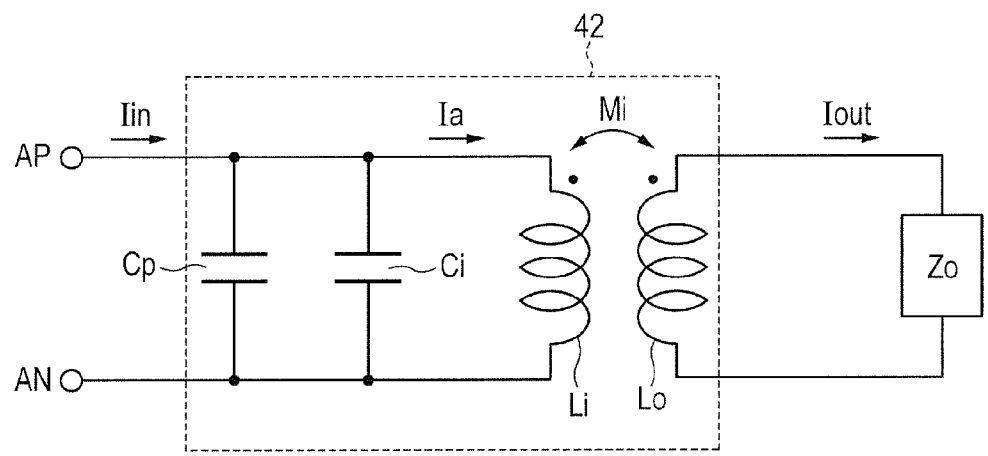
FIG. 7 is a diagram illustrating an alternating equivalent circuit of the transformer.

FIG. 7 is a diagram illustrating an alternating equivalent circuit of the transformer. In FIG. 7, the output nodes of the i-th LNA 40_i are identified as AP and AN, while the parasitic capacitance on the output side of the LNA 40_i is identified as Cp. Further, a current input from the LNA 40_i to the transformer 42 is identified as Iin, a current flowing through the primary inductor Li is identified as Ia, and a current output from the secondary inductor Lo is identified as Iout. The impedance of the circuit (quadrature demodulator 44) coupled to the secondary inductor Lo is identified as Zo. For the sake of simple descriptions below, the capacitance value of the variable capacitance element Ci is referred to as Ci, the inductance value of the primary inductor Li is referred to as Li, and the inductance value of the secondary inductor Lo is referred to as Lo. The angular frequency of the RF current signal Iin to be input is referred to as $\omega$, and the imaginary unit is referred to as j.

In this case, the current gain Iout/Iin of the transformer 42 is expressed by Equation (1). According to Equation (1), when the angular frequency ω satisfies Equation (2), the current gain becomes the maximum. That is, when the parallel resonance circuit is configured with the corresponding primary inductor Li, the variable capacitance element Ci, and the parasitic capacitance Cp, the current gain of the transformer 42 becomes the maximum.

[Equation 1]

$$\frac{Iout}{Iin} = \frac{j\omega \cdot Mi}{\{1 - \omega^2 \cdot Li \cdot (Ci + Cp)\} \cdot (Zo + j\omega \cdot Lo)} \quad (1)$$

$$\omega = \frac{1}{\sqrt{Li \cdot (Ci + Cp)}} \quad (2)$$

The primary inductors L1 to Ln included in the transformer 42 are independent elements, and thus can be designed to have arbitrary inductance values. Therefore, the inductance values of the primary inductors L1 to Ln and the capacitance values of the variable capacitance elements C1 to Cn can be in optimized ranges, in a manner that the parallel resonance circuits are configured to correspond respectively to the received RF signals of different frequency bands and input to the input ports RIN1 to RINn. As a result, it is possible to maximize the current gain when to amplify the received RF signals.

Figure 8:
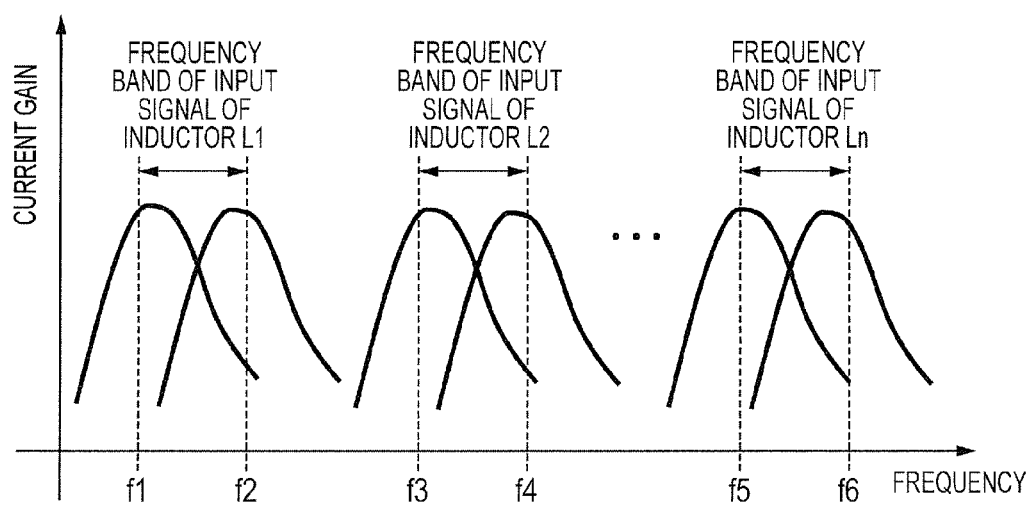
FIG. 8 is a diagram for explaining current gains of LNAs provided at a receiving unit.

FIG. 8 is a diagram for explaining the current gain of the LNA provided in the receiving unit. FIG. 8 exemplarily illustrates frequency bands of received RF signals to be respectively input to the primary inductors L1 to Ln. Specifically, the primary inductor L1 corresponds to a frequency band from frequencies f1 to f2, the primary inductor L2 corresponds to a frequency band from frequencies f3 to f4, the primary inductor Ln corresponds to a frequency band from frequencies f5 to f6.

For example, when to amplify the received RF signal included in the frequency band from the frequencies f1 to f2, the capacitance value of the variable capacitance element C1 is adjusted, in a manner that the current gain has a peak in the frequency of the received RF signal. The same applies to the received RF signals in other frequency bands. Accordingly, it is possible to correspond to various frequency ranges with one transformer 42.

[Effect of First Embodiment]

First, descriptions will be made to problems of when the load inductor and the variable capacitance element are shared without using the transformer. In this case, as the number of LNAs sharing the load inductor increases, an effect of the parasitic capacitance accompanying with the output side of the LNA becomes large. The following problems are derived by this parasitic capacitance.

As the first problem, the variation range of a resonance frequency is small due to an effect of the parasitic capacitance, when the capacitance value of the variable capacitance element is changed. As a result, the LNA is hardly operated in a wide band. For example, in the frequency band of 2.14 GHz and in the frequency band of 881.5 MHz, the resonance frequency is hardly changed. Therefore, the load inductor for these frequency bands cannot be shared. In other words, the load inductor can be shared, only when to amplify signals of relatively adjacent frequency bands.

As the second problem, as the parasitic capacitance increases, the impedance decreases at the end of the primary inductor, at the parallel resonance. This results in lowering the gain and the noise characteristic of the LNAs. In this case, to increase the gain of the LNAs and to improve the noise characteristic, it is necessary to increase the transconductance of the LNAs. This results in remarkably increasing the power consumption. Therefore, only a limited number of LNAs can share the load inductor, causing difficulty in reducing the area of the reception circuit.

For the above problems, in the receiving unit of the RFIC according to the first embodiment, as illustrated in FIG. 2 and FIG. 3, the primary inductors L1 to Ln of the n-input 1-output transformer 42 are used respectively as load inductors of the n-number of LNA 40_1 to 40_n. In this case, the primary inductors L1 to Ln and the secondary inductor Lo of the transformer 42 are arranged adjacent to each other, thus enabling to reduce the area.

Further, in each primary inductor, the gain of each LNA and the noise characteristic are not deteriorated, because mainly the parasitic capacitance on the output side of a corresponding LNA simply has an effect. The inductance values of the load inductors (i.e. the corresponding primary inductors) of the LNAs can individually be determined. Thus, it is possible to easily optimize the current gain, in association with each received RF signal to be input to each input port.

In the circuit of the LNA illustrated in FIG. 3 and FIG. 4, the inductor LS for degeneration is individually provided for each LNA. Instead of this, the inductor LS for degeneration may be shared between a plurality of LNAs, resulting in further reducing the circuit area.

<Second Embodiment> [Circuit Configuration of Receiving Unit]

Figure 9:
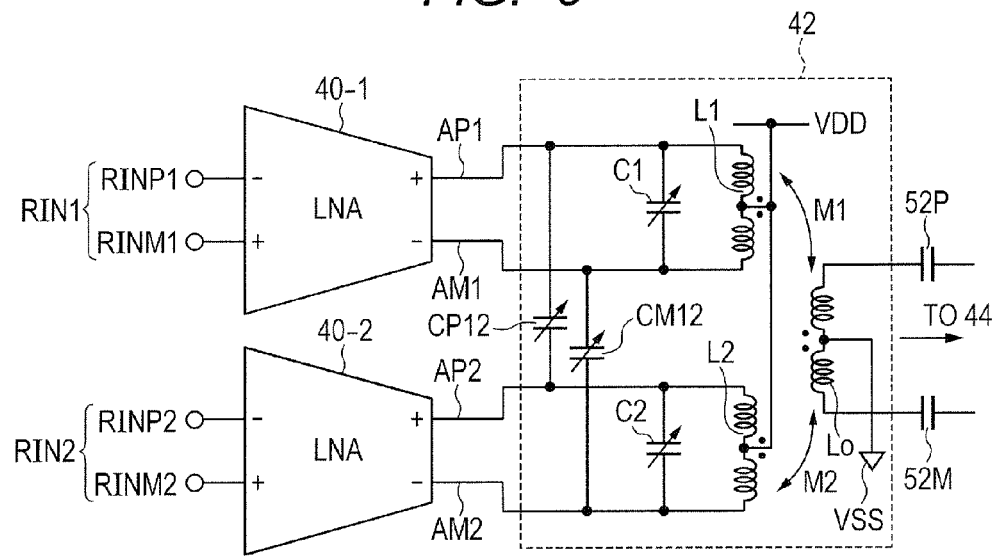
FIG. 9 is a diagram illustrating a partial circuit configuration of a receiving unit of an RFIC according to a second embodiment.

FIG. 9 is a diagram illustrating a partial circuit configuration of a receiving unit of an RFIC according to the second embodiment. FIG. 9 is to correspond to FIG. 3 for the first embodiment. The example of FIG. 9 includes two LNAs 40_1 and 40_2, and a 2-input 1-output transformer 42 (that is, n=2 in the case of FIG. 3).

As illustrated in FIG. 9, the transformer 42 according to the second embodiment differs from that of the first embodiment illustrated in FIG. 3, in a point that the transformer 42 of this embodiment further includes a variable capacitance element CP12 coupled between positive side output nodes AP1 and AP2 of the LNAs 40_1 and 40_2 and a variable capacitance element CM12 coupled between negative side output nodes AM1 and AM2 of the LNAs 40_1 and 40_2. The capacitance values of the variable capacitance elements CP12 and CM12 are controlled by the digital RF interface 28 or the baseband IC 10 (generally referred to as a control unit) of FIG. 1. Any other points of FIG. 9 are the same as those of FIG. 3. Thus, the same or corresponding parts are identified with the same reference numerals, and will not repeatedly be described.

[Circuit Operation]

Descriptions will now be made to a circuit operation of the receiving unit illustrated in FIG. 9. Like the first embodiment, one of the two LNAs 40_1 and 40_2 is activated, and the other one is inactivated. The method for switching the activation and inactivation of the LNAs is as described in FIG. 4 of the first embodiment.

In FIG. 9, the LNA 40_1 is in an inactivation state, while the LNA 40_2 is in an activation state. In this case, the primary inductor L1 in a no-input-signal state, while a signal is input to the primary inductor L2. As described in the first embodiment, a parallel resonance circuit is configured with the capacitance value of the variable capacitance element C2 together with the primary inductor L2, at a frequency of the input signal. The capacitance value of the variable capacitance element C1 is set to the possible minimum value (in this case, the variable capacitance element C1 can be ignored).

Figure 10:
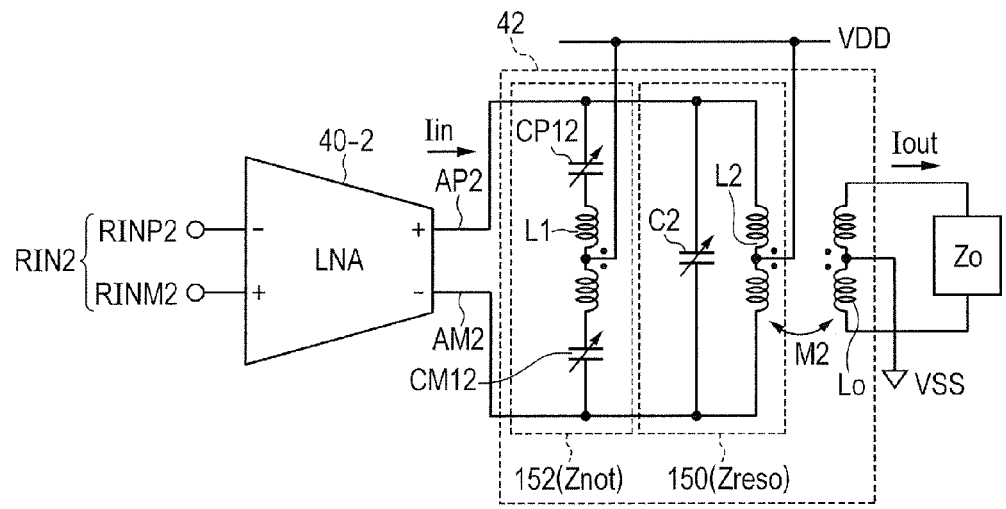
FIG. 10 is a diagram illustrating an equivalent circuit when a received RF signal is input to a second input port, in FIG. 9.

FIG. 10 is a diagram illustrating an equivalent circuit when a received RF signal is input to the second input port.

With reference to FIG. 10, a differential received RF signal is input to an input RIN2 (positive-side terminal RINP2, negative-side terminal RINM2). In this case, the LNA 40_2 is activated, under the control of the digital RF interface 28 or the baseband IC 10 (both are generally referred to as a control unit) of FIG. 1. The primary inductor L2 coupled to the LNA 40_2 is used as a signal transmission path.

A parallel resonance circuit 150 is configured with the primary inductor L2 and the variable capacitance element C2 at a frequency of the received RF signal. As a result, it is possible to attain the maximum current gain in a corresponding frequency range.

The primary inductor L1 is coupled to the output nodes AP2 and AM2 of the LNA 40_2, respectively through two variable capacitance elements CP12 and CM12. A band elimination filter 152 is configured with the variable capacitance elements CP12 and CM12 and the primary inductor L1.

When the capacitance values of the variable capacitance elements CP12 and CM12 are identified as Cp and Cm, it is defined that p+1/Cm=1/Cn . . . (3). When the impedance Znot of the band elimination filter 152 can be obtained by Equation (4). In Equation (4), when the angular frequency ω satisfies Equation (5), the impedance Znot becomes 0 (that is, a series resonance circuit is configured with the primary inductor L1 and the variable capacitance elements CP12 and CM 12 at the angular frequency ω). The frequency at this time is referred to as a notch frequency Fnot=ω/(2·π).

[Equation 2]

$$Znot = \frac{1 - \omega^2 \cdot L1 \cdot Cn}{j\omega \cdot Cn} \quad (4)$$

$$\omega = \frac{1}{\sqrt{L1 \cdot Cn}} \quad (5)$$

Like the case of Equation (1), in FIG. 10, if the current gain Iout/Iin of the transformer is obtained, Equation (6) can be obtained. Note that the impedance Zo of the circuit (quadrature demodulator 44) coupled to the secondary inductor Lo is ignorable as compared to ω·Lo. According to Equation (6), when the angular frequency ω satisfies Equation (5) (i.e., when the circuit 152 is a series resonance circuit), the current gain becomes 0. When each frequency ω satisfies Equation (7) (i.e., when the circuit 150 is a parallel resonance circuit), the current gain is maximized.

[Equation 3]

$$\frac{Iout}{Iin} = \frac{M2 \cdot (1 - \omega^2 \cdot L1 \cdot Cn)}{\{(1 - \omega^2 \cdot C2 \cdot L2) \cdot (1 - \omega^2 \cdot L1 \cdot Cn) - \omega^2 \cdot Cn \cdot L2\} \cdot Lo} \quad (6)$$

$$\omega = \frac{1}{\sqrt{L2 \cdot C2}} \quad (7)$$

Figure 11:
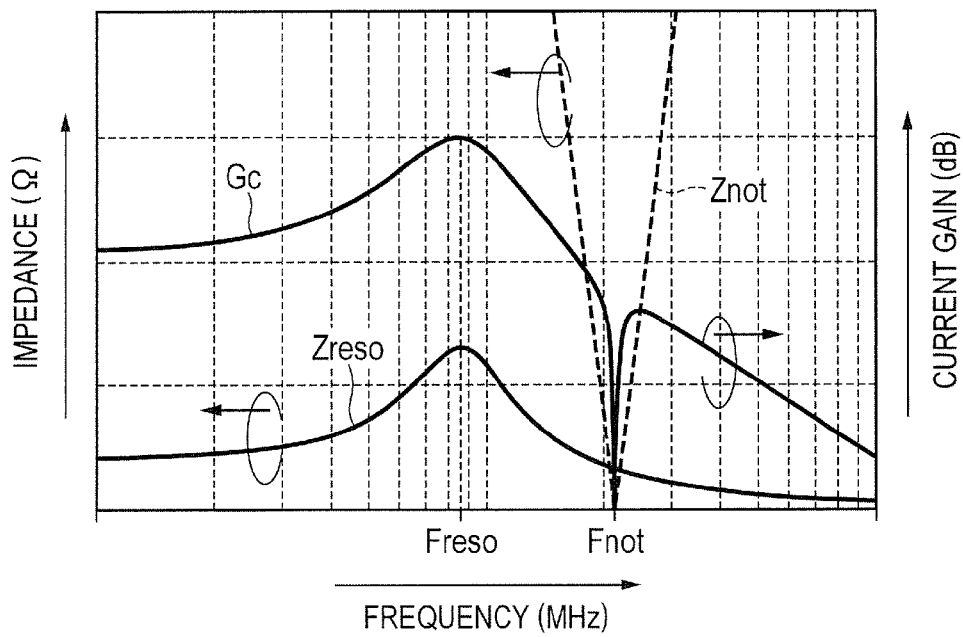
FIG. 11 is a diagram illustrating the frequency characteristic of the impedance at each unit of FIG. 10 and the frequency characteristic of a current gain of a transformer.

FIG. 11 is a diagram illustrating the frequency characteristic of the impedance of each unit of FIG. 10 and the frequency characteristic of the current gain of the transformer. Specifically, FIG. 11 illustrates the impedance Zreso of the parallel resonance circuit 150 of FIG. 10, the impedance Znot of the band elimination filter 152, and the current gain Gc of the transformer.

With reference to FIG. 10 and FIG. 11, the received RF signal is amplified by the LNA 40_2, and converted into a current signal. The current signal output from the LNA 40_2 is branched into the above-described parallel resonance circuit 150 and the band elimination filter 152. The impedance Zreso of the parallel resonance circuit 150 and the impedance Znot of the band elimination filter 152 are changed and depend on the frequency. Thus, an amount of current flowing through each circuit is changed and depends also on the frequency.

When the frequency of the received RF signal is around the notch frequency Fnot of the band elimination filter 152, the impedance Znot of the band elimination filter 152 is sufficiently lower than the impedance Zreso of the parallel resonance circuit 150. In this case, the current signal output from the LNA 40_2 flows substantially to the band elimination filter 152, and no current signal is output from the secondary inductor Lo. Around the notch frequency Fnot, the current gain Gc is approximately 0, and the characteristics of the band elimination filter are exhibited.

In the frequency range other than a neighborhood of the notch frequency Fnot, the impedance Znot of the band elimination filter 152 is greater than the impedance Zreso of the parallel resonance circuit 150. Thus, the current signal output from the LNA 40_2 substantially flows through the parallel resonance circuit 150, and a current signal is transmitted to the secondary inductor Lo by electromagnetic induction. The current gain Gc has the maximum value in the resonance frequency Freso.

[Effect of Second Embodiment]

The receiving unit of the RFIC according to the second embodiment exhibits the further effect by the band elimination filter 152, in addition to the effect described in the first embodiment. Descriptions will hereinafter be made to the effect of the band elimination filter 152 of FIG. 10.

As the first effect, it is possible to suppress the effect of the parasitic magnetic coupling between the primary inductors of the transformer, with using the band elimination filter.

Figure 12:
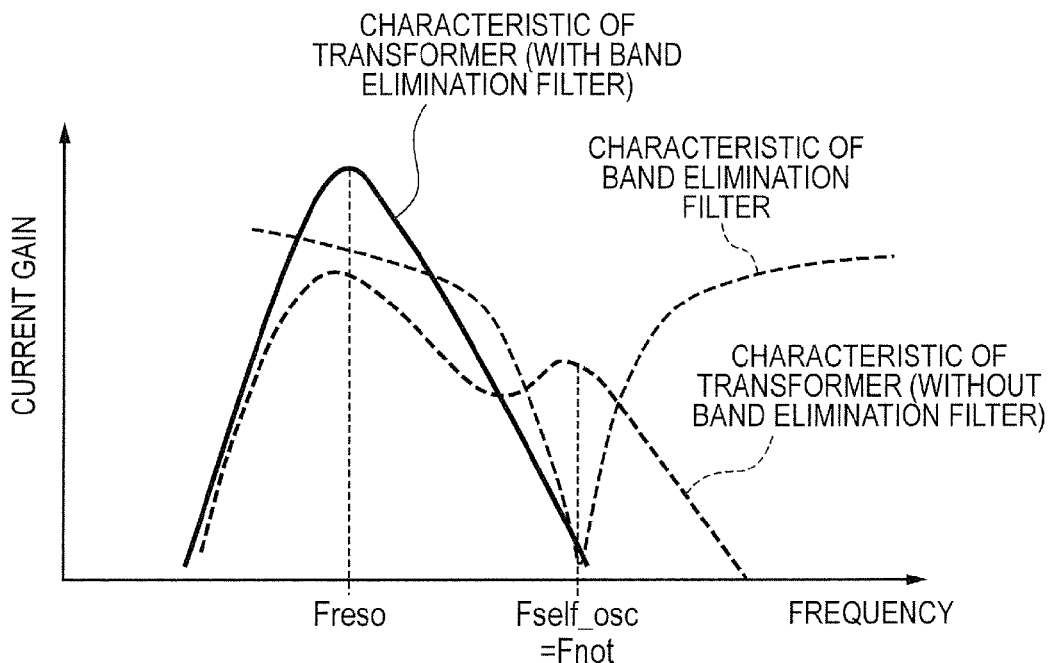
FIG. 12 is a diagram for explaining the effect of a band elimination filter of FIG. 10.

FIG. 12 is a diagram for explaining the effect of the band elimination filter of FIG. 10. In FIG. 12, a thick broken line indicates the frequency characteristic of the current gain of the transformer, when no band elimination filter is provided (the case of the first embodiment). A thick solid line indicates the frequency characteristic of the current gain of the transformer, when a band elimination filter is provided (the case of the second embodiment). A thin broken line indicates the frequency characteristic of a single band elimination filter.

In the transformer 42, the primary inductors L1 and L2 are arranged adjacent to each other, and thus are magnetically coupled to each other. A high degree of magnetic coupling causes a decrease in the current gain of the transformer, due to an effect of the frequency characteristic of the primary inductor in a no-input-signal state.

Specifically, as illustrated in the case without the band elimination filter in FIG. 12, the current gain increases in a self-resonance frequency Fself_osc of the primary inductor in the no-input-signal state. In this case, the self-resonance frequency implies a frequency when the self-inductance and the parasitic line capacity cause a resonance phenomenon. Further, the current gain decreases in the resonance frequency Freso of the parallel resonance circuit 150 of FIG.

10, due to an effect of the increased impedance at the end of the primary inductor in the no-input-signal state.

The capacitance values of the variable capacitance elements CP12 and CM12 are adjusted in a manner that the notch frequency Fnot of the band elimination filter 152 of FIG. 9 will be equal to the self-resonance frequency Fself_osc of the primary inductor in the no-input-signal state. As indicated by a graph with the thick solid line FIG. 12, it is possible to remove the effect of the frequency characteristic of the primary inductor in the no-input-signal state, by the band elimination filter, thereby improving the current gain in the resonance frequency Freso.

Further, as the second effect, it is possible to suppress an interference wave at the input terminal of the LNA, with using the band elimination filter 152.

The intensity of the interference wave may remarkably be larger than the intensity of a predetermined RF signal received by the antenna. The interference wave may possibly be a leakage signal from the local oscillation circuit and/or the transmission power amplifier equipped on the same chip. When this very large interference wave and the received RF signal are both input to the receiving unit of the RFIC, the characteristic of the receiving unit is nonlinear due to the effect of the interference wave of the receiving unit, thereby deteriorating the reception characteristic.

The interference wave is suppressed using the band elimination filter 152, by matching the notch frequency Fnot of the band elimination filter 152 of FIG. 10 with the frequency of the interference wave. As a result, the signal process can be executed without deteriorating the linearity of a circuit in a post-stage of the LNA.

[Modification of Second Embodiment]

In the second embodiment, when the receiving unit includes three LNAs 40_1 to 40_3 and a 3-input 1-output transformer 42 (i.e., n=3 in FIG. 3), six variable capacitance elements CP12, CP13, CP23, CM12, CM13, and CM23 are added, in addition to the configuration of FIG. 3.

Specifically, the variable capacitance element CP12 is coupled between the positive-side output node AP1 of the LNA 40_1 and the positive-side output node AP2 of the LNA 40_2. The variable capacitance element CP13 is coupled between the positive-side output node AP1 of the LNA 40_1 and the positive-side output node AP3 of the LNA 40_3. The variable capacitance element CP23 is coupled between the positive-side output node AP2 of the LNA 40_2 and the positive-side output node AP3 of the LNA 403. That is, the variable capacitance elements CP12, CP13, and CP23, are provided to correspond respectively to all pairs of the LNAs 40_1 to 40_3 (or all pairs of the primary inductors L1 to L3).

Similarly, the variable capacitance element CM12 is coupled between the negative-side output node AM1 of the LNA 40_1 and the negative-side output node AM2 of the LNA 40_2. The variable capacitance element CM13 is coupled between the negative-side output node AM1 of the LNA 40_1 and the negative-side output node AM3 of the LNA 403. The variable capacitance element CM23 is coupled between the negative-side output node AM2 of the LNA 40_2 and the negative-side output node AM3 of the LNA 40_3. That is, the variable capacitance elements CM12, CM13, and CM23 are provided to correspond respectively to all pairs of the LNA 40_1 to 40_3 (or all pairs of the primary inductors L1 to L3).

For example, when the received RF signal is input to the LNA 40_1, the capacitance value of the variable capacitance element C1 is adjusted in a manner that a parallel resonance circuit for the received RF signal is configured with the primary inductor L1 and the variable capacitance element C1. Further, a series resonance circuit is configured with the variable capacitance elements CP12 and CM12, coupled to the primary inductor L1 and the primary inductor L2, and the primary inductor L2 at a predetermined frequency (the self resonance frequency of the primary inductor L2 or the frequency of the interference wave). Similarly, the capacitance values of the variable capacitance elements CP13 and CM13 are adjusted in a manner that a series resonance circuit is configured with the variable capacitance elements CP13 and CM13, coupled between the primary inductor L1 and the primary inductor L3, and the primary inductor L3 at a predetermined frequency (the self resonance frequency of the primary inductor L3 or the frequency of the interference wave).

Descriptions will be made to the configuration of the second embodiment, in the case of the receiving unit including generally the n-number of LNAs 40_1 to 40_n and the n-input 1 output transformer 42, as compared with the configuration of FIG. 3. In this case, the n!/2-number (n! indicates the factorial of n) of positive-side variable capacitance elements are provided to correspond respectively to all pairs of the n-number of primary inductors L1 to Ln (or n-number of LNAs 40_1 to 40_n). Similarly, the n!/2-number of negative-side variable capacitance elements are provided to correspond respectively to all pairs of the n-number of primary inductors L1 to Ln (or n-number of LNAs 40_1 to 40_n). The positive-side variable capacitance elements are coupled between the positive-side terminals of a corresponding pair of primary inductors (or between the positive-side output nodes of a corresponding pair of LNAs). The negative-side variable capacitance elements are coupled between the negative-side terminals of a corresponding pair of primary inductors (or between the negative-side output nodes of a corresponding pair of LNAs).

When the received RF signal is input to a selected LNA 40_i (1≤I≤n) in the activation state, a parallel resonance circuit is configured with the primary inductor Li and the variable capacitance element Ci, coupled between the differential output nodes of the LNA 40_i, at a frequency of the received RF signal. Further, the positive-side variable capacitance element (coupled between the primary inductor Li corresponding to the selected LNA40_i and a primary inductor Lj (j≠i) not corresponding to a selected low noise amplifier) is indicated as CPij (or CPji), and the negative-side variable capacitance element is indicated as CMij (or CMji). A series resonance circuit is configured with the positive-side variable capacitance element CPij (or CPji), the negative-side variable capacitance element CMij (or CMji), and the primary inductor Lj at a predetermined frequency. The predetermined frequency of this case is a self-resonance frequency of the primary inductor Lj or a frequency of the interference wave input to the LNA 40_i.

<Third Embodiment> [First Circuit Configuration Example]

Figure 13:
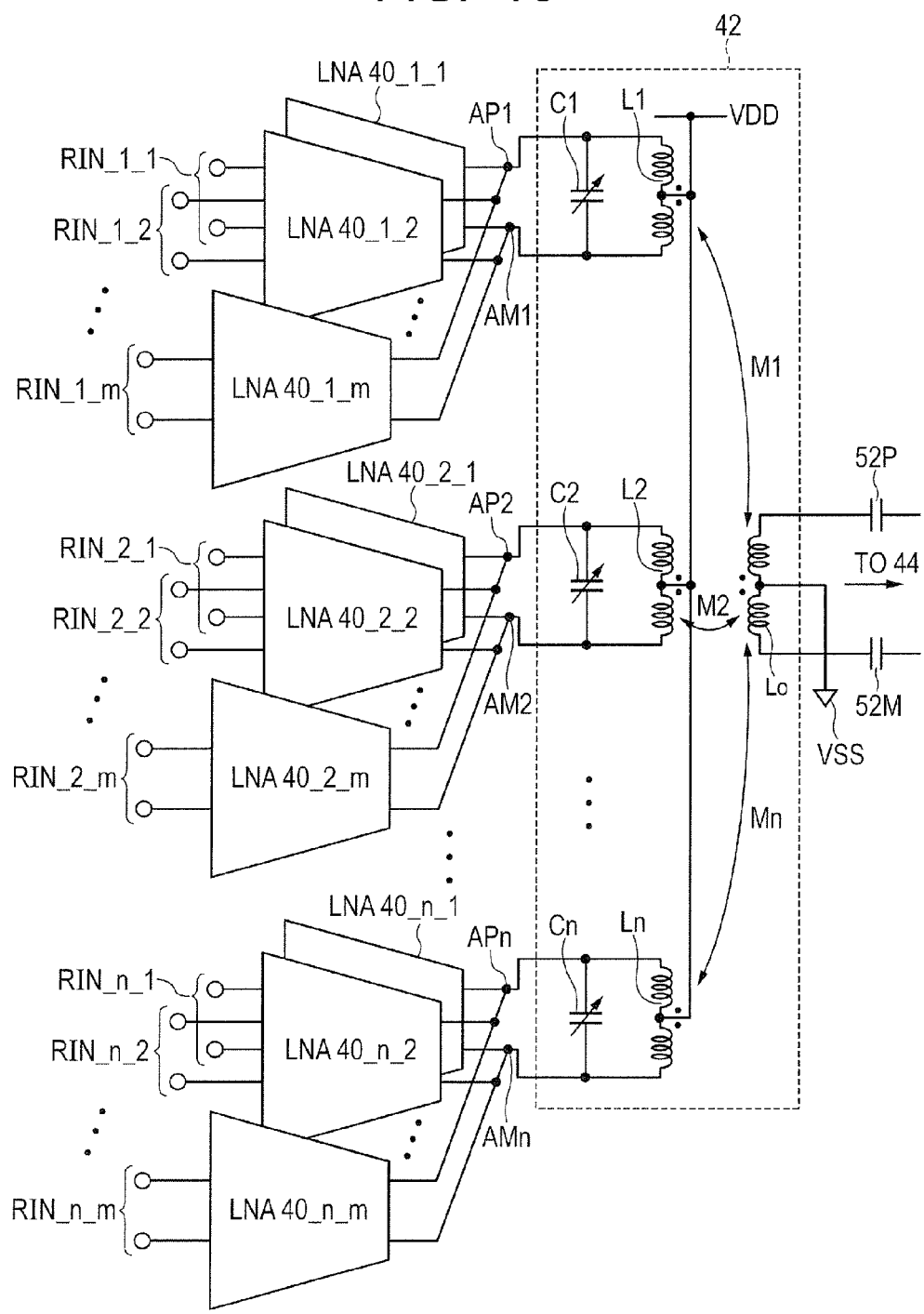
FIG. 13 is a diagram illustrating a partial circuit configuration of a receiving unit of an RFIC according to a third embodiment.

FIG. 13 is a diagram illustrating a partial circuit configuration of a receiving unit of an RFIC according to the third embodiment. FIG. 13 is to correspond to FIG. 3 for the first embodiment.

The receiving unit of the third embodiment differs from that of the first embodiment in a point that each of the primary inductors of a transformer 42 is shared by a plurality of LNAs 40. FIG. 13 illustrates an example in which each of the primary inductors is shared by m-number of LNAs 40.

Specifically, the receiving unit of FIG. 13 includes n×m-number of LNAs 40, n×m-number of input ports RIN, n-number of primary inductors L1 to Ln, a secondary inductor Lo, and n-number of variable capacitance elements C1 to Cn. The n-input 1-output transformer 42 is configured with the primary inductors L1 to Ln and the secondary inductor Lo.

As illustrated in FIG. 13, differential input nodes of an LNA 40_i_j (i and j are integers satisfying 1≤I≤n and 1≤j≤m) are coupled to a pair of input terminals included in an input port RIN_i_j. Differential output nodes of the LNA 40_i_j are coupled to both ends of the primary inductor Li. That is, the primary inductor Li ("i" is an integer satisfying 1≤I≤n) is shared by three LNAs 40_i_1, 40_i_2, . . . , 40_40_i_m. Any other points of FIG. 13 are the same as those of FIG. 3. Thus, the same or corresponding parts are identified with the same reference numerals, and will not repeatedly be described.

Specific circuit operations are same as those of the first embodiment. A differential received RF signal is input to one input port of the n×m-number of input ports RIN. For example, let it be assumed that a signal received by the antenna is input to an input port RIN_1_1. In this case, an LNA 40_1_1 corresponding to the input port RIN_1_1 is activated, while another LNA 40_i_j (i≠1 and j≠1) is inactivated. The capacitance value of the variable capacitance element C1 is adjusted in a manner that a parallel resonance circuit is configured with the variable capacitance element C1 and the primary inductor L1. The capacitance values of the rest of variable capacitance elements C2 to Cn are set to the minimum value in a possible range. As a result, a received RF signal is transmitted to the second inductor Lo through the primary inductor L1 as a signal transmission path.

According to the above-described configuration of the receiving unit, a signal process can possibly be executed for received signals in many frequency bands, as compared with the first embodiment. As a result, it is possible to reduce the area of the post-stage circuit. The third embodiment may possibly be combined with the second embodiment.

[Second Circuit Configuration Example]

Figure 14:
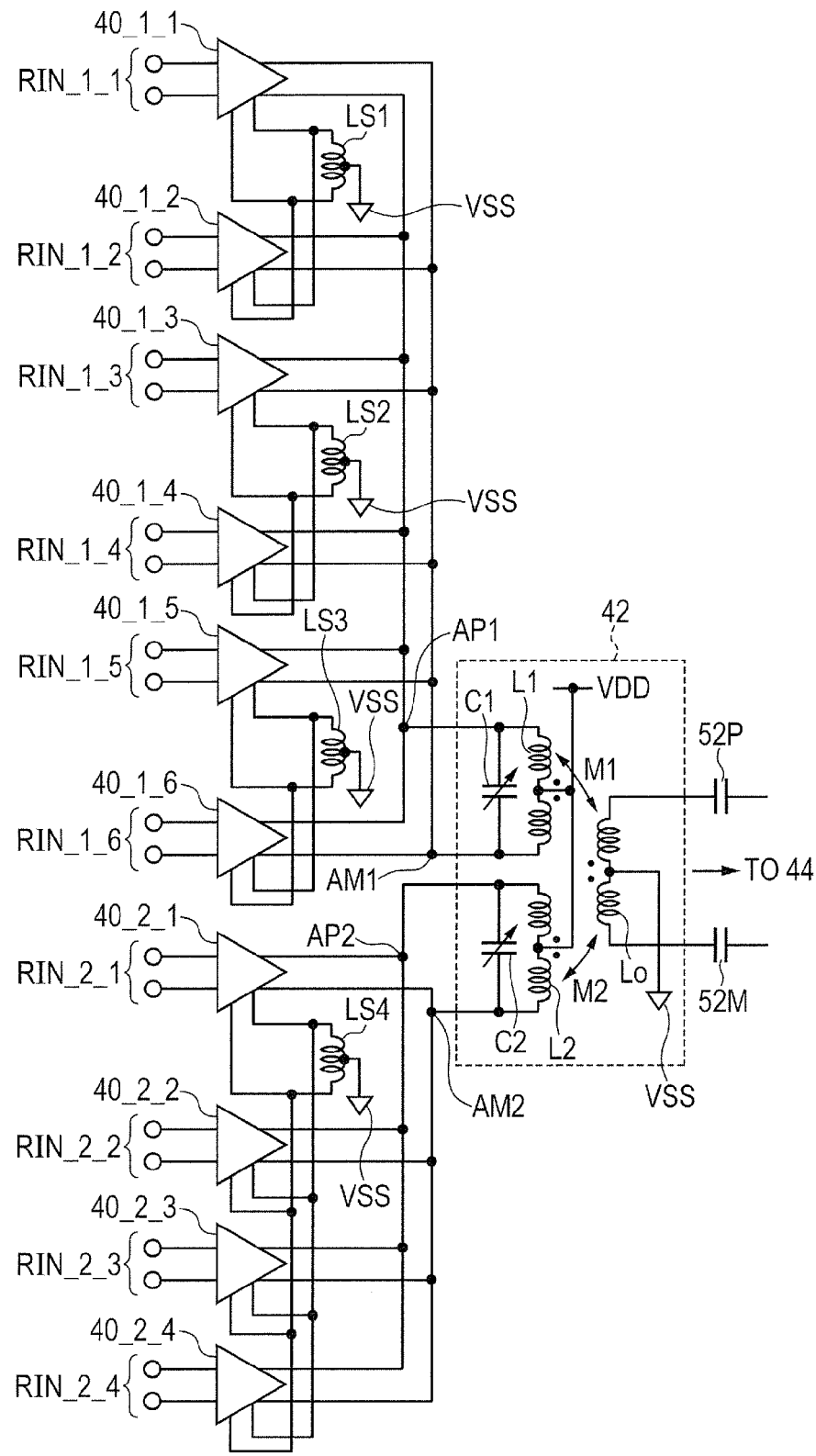
FIG. 14 is a circuit diagram illustrating a modification of FIG. 13.

FIG. 14 is a circuit diagram illustrating a modification of FIG. 13. FIG. 14 is to correspond to FIG. 3 for the first embodiment. The receiving unit of FIG. 14 includes 10 LNAs 40_1_1 to 40_1_6, 40_2_1 to 40_2_4, two primary inductors L1 and L2, a secondary inductor Lo, and two variable capacitance elements C1 and C2. A 2-input 1-output transformer 42 is configured with the primary inductors L1 and L2, and the secondary inductor Lo.

As illustrated in FIG. 14, differential input nodes of the LNA 40_1_1 to 40_1_6 are coupled respectively to input ports RIN_1_1 to RIN_1_6. Differential input nodes of the LNA 40_2_1 to 40_2_4 are coupled respectively to input ports RIN_2_1 to RIN_2_4. Differential output nodes of the LNA 40_1_1 to 40_1_6 are coupled to both ends of the primary inductor L1. That is, the primary inductor L1 is shared by the LNAs 40_1_1 to 40_1_6. Differential output nodes of the LNA 40_2_1 to 40_2_4 are coupled to both ends of the primary inductor L2. That is, the primary inductor L2 is shared by the LNAs 40_2_1 to 40_2_4.

Further, the LNA 40_1_1 and the LNA 40_1_2 share an inductor LS1 for degeneration. The LNA 40_1_3 and the LNA 40_1_4 share an inductor LS2 for degeneration. The LNA 40_1_5 and the LNA 40_1_6 share an inductor LS3 for degeneration. The LNA 40_2_1 to 40_2_4 share an inductor LS4 for degeneration.

Accordingly, the inductors for degeneration are shared, thereby enabling to reduce the circuit area. Any other points of FIG. 14 are the same as those of FIG. 3. Thus, the same or corresponding parts are identified with the same reference numerals, and will not repeatedly be described.

Figure 15:
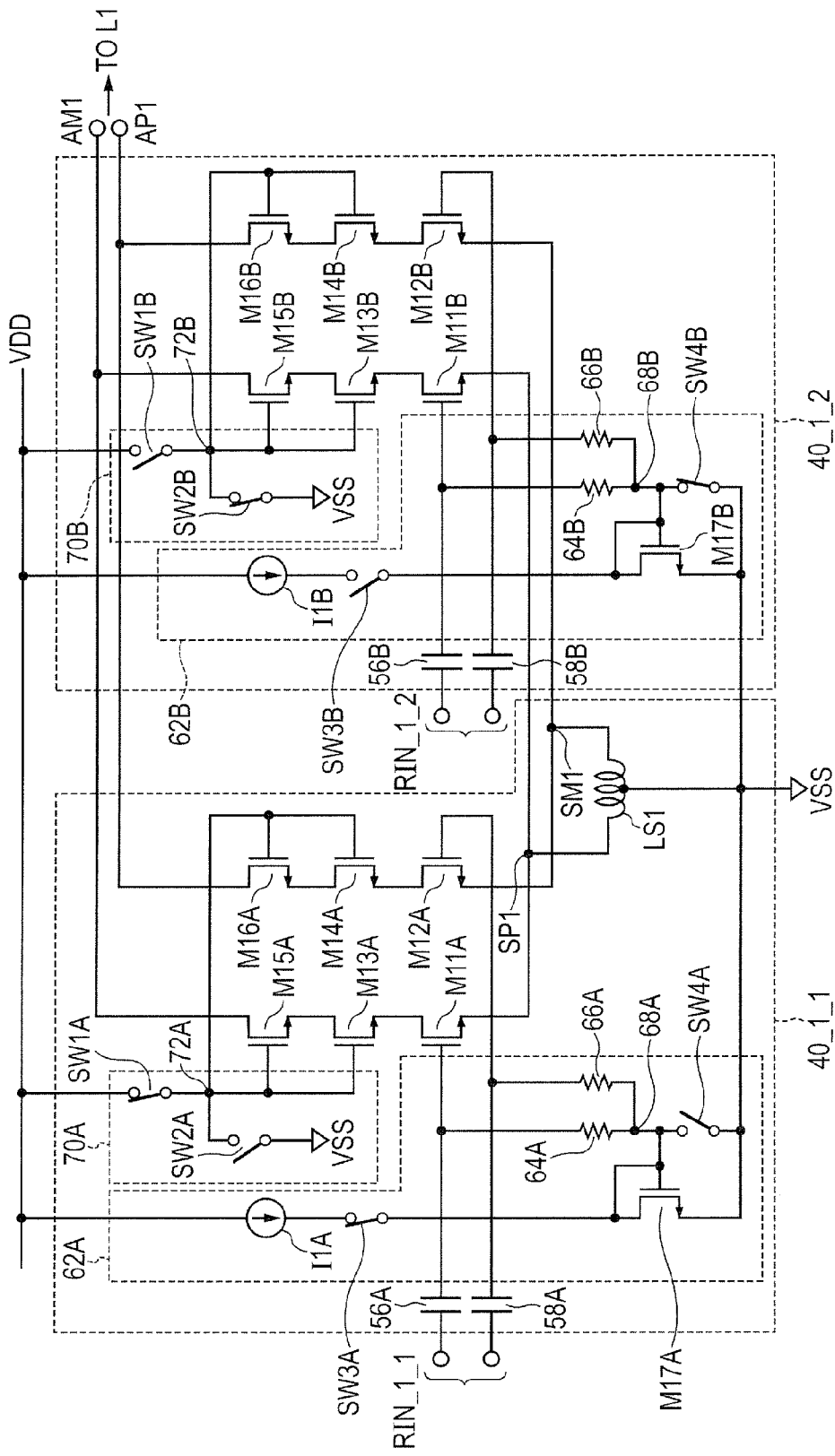
FIG. 15 is a diagram illustrating a circuit configuration of apart of LNAs of FIG. 14.

FIG. 15 is a diagram illustrating circuit configurations of a part of the LNAs of FIG. 14. FIG. 15 illustrates the circuit configuration of the LNA 40_1_1 and the LNA 40_1_2 sharing the inductor LS1 for degeneration. The configurations of the rest of LNAs sharing the inductors LS2 to LS4 are the same as those of FIG. 15.

With reference to FIG. 15, the circuit configuration of the LNAs 40_1_1 and 40_1_2 is the same as that of the circuit configuration of the LNA 40 of FIG. 4, except the point that the inductor LS1 for degeneration is shared. Specifically, the reference numerals of the constituent elements of the LNA 40_1_1 include "A" attached at the end thereof corresponding to the constituent elements of the LNA 40 of FIG. 4. Specifically, the reference numerals of the constituent elements of the LNA 40_1_1 include "A" attached at the end thereof corresponding to the constituent elements of the LNA 40 of FIG. 4. The reference numerals of the constituent elements of the LNA 40_1_2 include "B" attached at the end thereof corresponding to the constituent elements of the LNA 40 of FIG. 4.

In the LNA 40_1_1, the source of an NMOS transistor M11A is coupled to an end (node SP1) of the inductor LS1. The source of an NMOS transistor M12A is coupled to the other end (node SM1) of the inductor LS1. The drain of an NMOS transistor M15A is coupled to the node AM1 of FIG. 14, while the drain of an NMOS transistor M16A is coupled to the node AP1 of FIG. 14.

Similarly, in the LNA 40_1_2, the source of an NMOS transistor M11B is coupled to an end (node SP1) of the inductor LS1. The source of an NMOS transistor M12B is coupled to the other end (node SM1) of the inductor LS1. The drain of an NMOS transistor M15B is coupled to the node AM1 of FIG. 14, while the drain of an NMOS transistor M16B is coupled to the node AP1 of FIG. 14.

<Fourth Embodiment> [Circuit Configuration of Receiving Unit]

Figure 16:
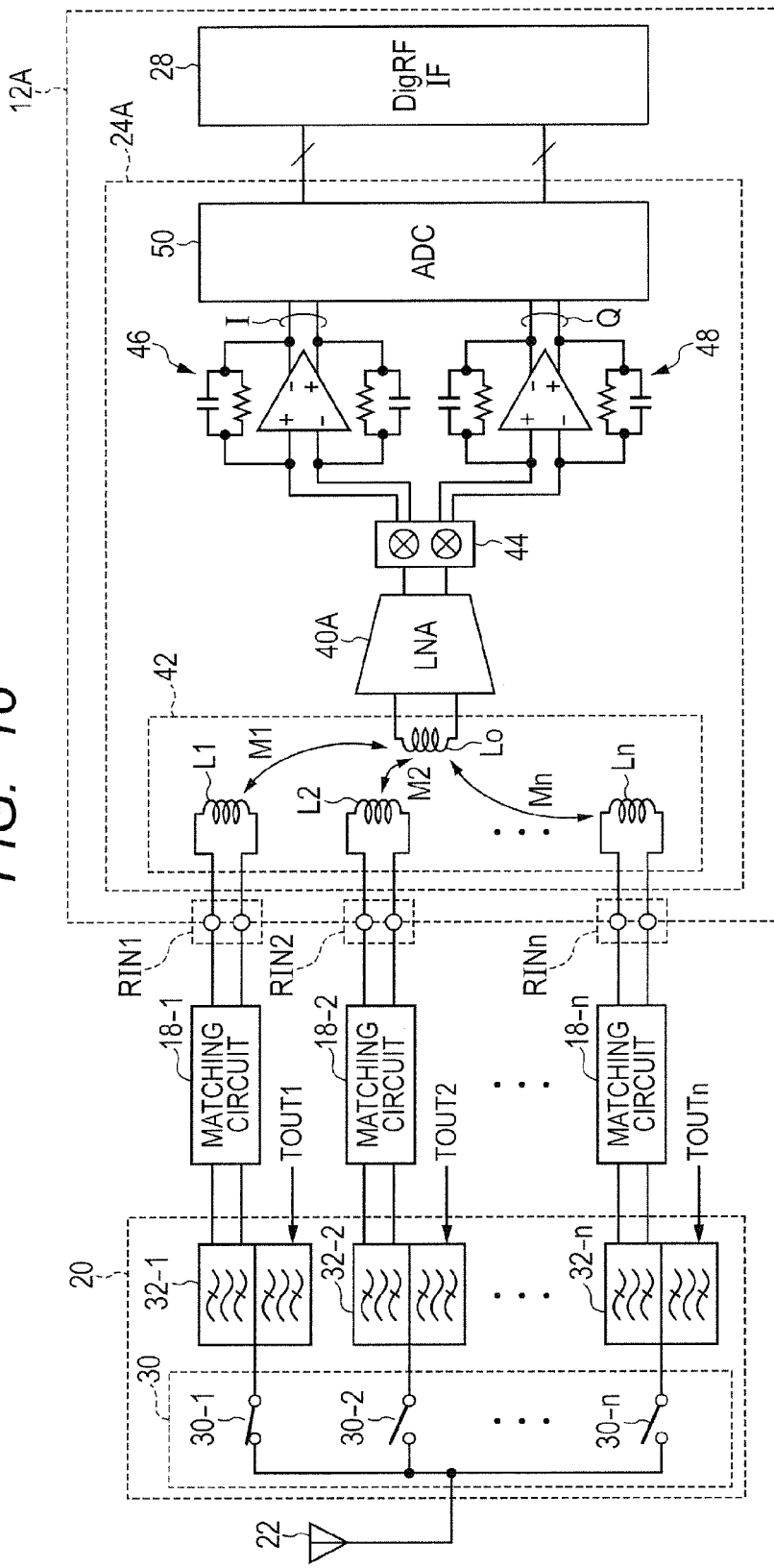
FIG. 16 is a block diagram illustrating a configuration of a receiving unit of an RFIC according to a fourth embodiment.

FIG. 16 is a block diagram illustrating a configuration of a receiving unit of an RFIC according to the fourth embodiment. FIG. 16 is to correspond to FIG. 2 for the first embodiment. FIG. 16 illustrates reception matching circuits 18_1 to 18_n, a front-end module 20, and an antenna 22, in addition to an RFIC 12A.

A receiving unit 24A of an RFIC 12A of FIG. 16 differs from the receiving unit 24 of FIG. 2, in a point that one LNA 40A is provided in place of the n-number of LNAs 40_1 to 40_n. Further, the receiving unit 24A of FIG. 16 differs from the receiving unit 24 of FIG. 2, in a point that that the LNA 40A is arranged in a post-stage of the transformer 42.

Specifically, the primary inductors L1 to Ln included in the transformer 42 are coupled to input terminal pairs of the input ports RIN1 to RINn. The secondary inductor Lo is coupled to a differential input node(s) of the LNA 40A. A differential output node(s) of the LNA 40A is(are) coupled to the quadrature demodulator 44. Any other points of FIG. 16 are the same as those of FIG. 2. Thus, the same or corresponding parts are identified with the same reference numerals, and will not repeatedly be described.

Figure 17:
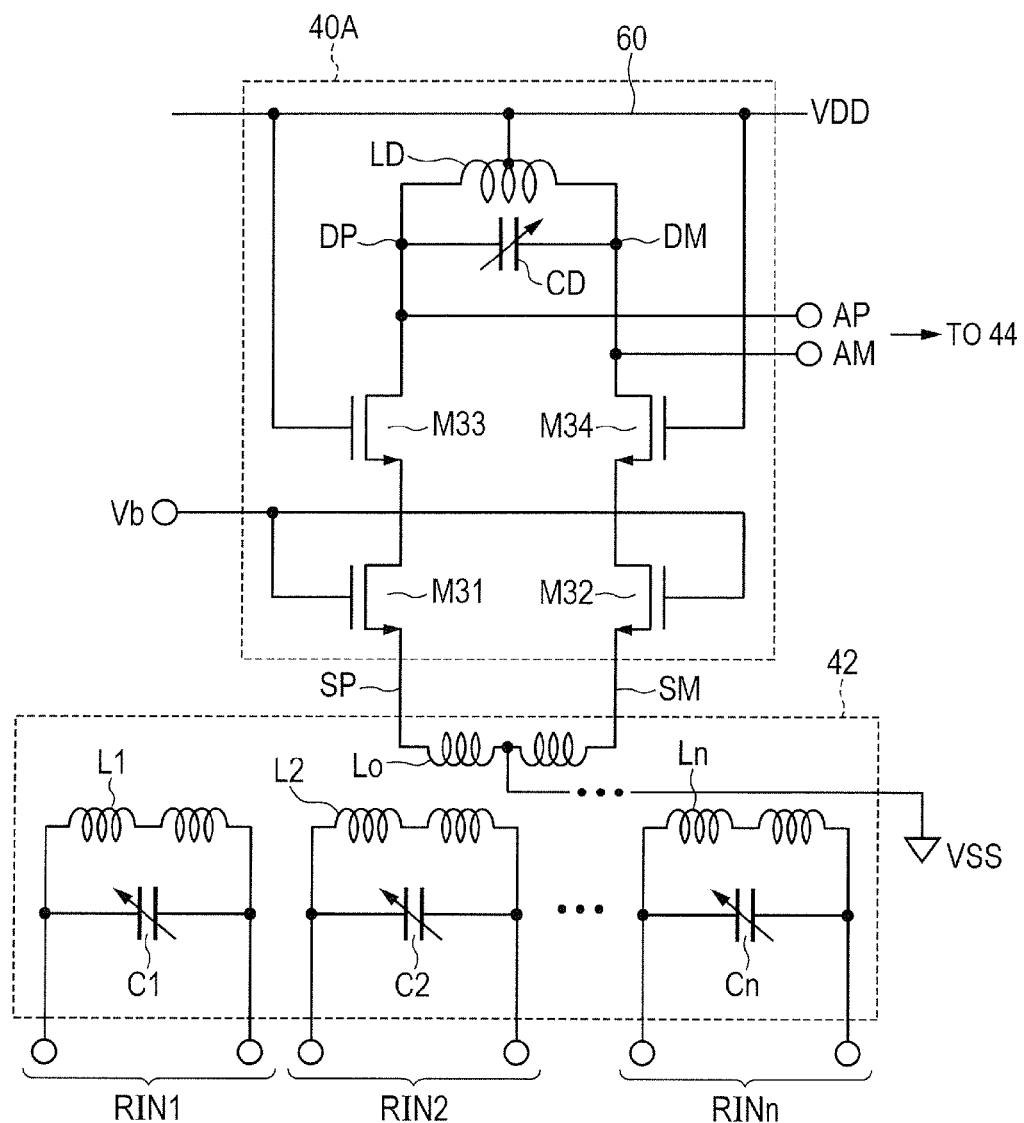
FIG. 17 is a circuit diagram illustrating a detailed configuration of a transformer and an LNA of FIG. 16.

FIG. 17 is a circuit diagram illustrating a detailed configuration of the transformer and the LNA of FIG. 16. With reference to FIG. 17, the transformer 42 further includes variable capacitance elements C1 to Cn coupled parallelly to the respective primary inductors L1 to Ln. Like the first to third embodiments, a parallel resonance circuit is configured with each of the primary inductors and its corresponding variable capacitance element, when a received signal is input.

The LNA 40A is formed as a cascode-coupled gate ground circuit. Specifically, the LNA 40A includes NMOS transistors M31 to M34, a load inductor LD, a variable capacitance element CD, and output nodes AP and AM. The middle point of the load inductor LD is coupled to the power line 60.

The NMOS transistors M31 and M33 are coupled in series between an end (node SP) of the secondary inductor Lo and an end (node DP) of the load inductor LD, in this order. The NMOS transistors M32 and M34 are coupled in series between the other end (node SM) of the secondary inductor Lo and the other end (node DM) of the load inductor LD, in this order. A bias voltage Vb is supplied to the gates of the NMOS transistors M31 and M32. The gates of the NMOS transistors M33 and M34 are coupled to the power line 60. The drains of the NNOS transistors M33 and M34 are coupled respectively to the output nodes AP and AM.

The variable capacitance element CD is parallelly coupled to the load inductor LD. The capacitance value of the variable capacitance element CD is adjusted, in a manner that a parallel resonance circuit is configured with the variable capacitance element CD and the load inductor LD at a frequency of a received RF signal.

[Circuit Operation]

Descriptions will now be made to circuit operations of FIG. 17. A received RF signal is input to one input port of n-number of input ports RIN1 to RINn. The capacitance values of the variable capacitance elements C1 to Cn are controlled by the RF interface 28 of FIG. 16 or the baseband IC 10 (both are generally referred to as a control unit). Specifically, the capacitance value of a corresponding variable capacitance element is set, in a manner that the parallel resonance circuit is configured with a primary inductor and the variable capacitance element corresponding to the input port RIN with a received RF signal input thereto at a frequency of the received RF signal. In this case, the current gain of the transformer 42 becomes the maximum. The capacitance values of other variable capacitance elements are set to the possible minimum value.

The received RF signal is transmitted from the primary inductor with a signal input thereto and the secondary inductor Lo by electromagnetic induction. The received RF signal is input to the LNA 40A configured as a gate ground circuit. In the LNA 40A also, the capacitance value of the variable capacitance element CD is adjusted by the control unit in a manner that the parallel resonance circuit is configured with the load inductor LD and the corresponding variable capacitance element CD at a frequency of the received RF signal. The received RF signal amplified by the LNA 40A is output to the quadrature demodulator 44 through the differential output nodes AP and AM.

[Effect of Fourth Embodiment]

In the first embodiment, the n-number of LNA 40_1 to 40_n are necessary for receiving the received RF signals of the n-number of frequency bands. On the other hand, in this embodiment, only one LNA 40A is necessary. Thus, it is possible to further reduce the circuit area as compared with the first embodiment.

Accordingly, the descriptions have been specifically be made to the inventions by the present inventors based on the preferred embodiments. However, the present invention is not limited to the above embodiments, and various changes may be made without departing from the scope thereof.

What is claimed is:

1. A semiconductor device comprising:
   a plurality of primary inductors;
   a secondary inductor which is provided commonly for the primary inductors, and magnetically coupled to each of primary inductors;
   a demodulator which converts a signal transmitted from one of the primary inductors to the secondary inductor by electromagnetic induction, into a signal of a low frequency; and
   a plurality of low noise amplifiers,
   wherein at least one of the low noise amplifiers corresponds to each of the primary inductors, and
   wherein each of the primary inductors is coupled between differential output nodes of a corresponding one of the plurality of low noise amplifiers.

2. The semiconductor device according to claim 1,
   wherein each of the low noise amplifiers switches between an activation state in which an input signal can be amplified and an inactivation state in which an input signal is interrupted,
   wherein the semiconductor device further includes a control unit,
   wherein the control unit is configured to select one of the low noise amplifiers, control the selected low noise amplifier to be in the activation state, and control the rest of the low noise amplifiers to be in the inactivation state, thereby transmitting the signal input to the selected low noise amplifier to the secondary inductor.

3. The semiconductor device according to claim 2, further comprising
   a plurality of first variable capacitance elements which respectively correspond to the primary inductors, and are coupled in series respectively to the corresponding primary inductors.

4. The semiconductor device according to claim 3,
   wherein the control unit is configured to set a capacitance value of each of the corresponding first variable capacitance elements, in a manner that a parallel resonance circuit is configured with the primary inductor corresponding to the selected low noise amplifier and the first variable capacitance element at a frequency of the signal input to the selected low noise amplifier.

5. The semiconductor device according to claim 4,
   wherein the control unit is configured to set a capacitance value of rest of the first variable capacitance element except the first variable capacitance element corresponding to the selected low noise amplifier, to a possible minimum value.

6. The semiconductor device according to claim 3, further comprising:
   a plurality of second variable capacitance elements respectively corresponding to all pairs of the primary inductors; and
   a plurality of third variable capacitance elements respectively corresponding to all pairs of the primary inductors,
   wherein each of the second variable capacitance elements is coupled between first ends of a corresponding pair of primary inductors, and
   wherein each of the second variable capacitance elements is coupled between second ends of a corresponding pair of primary inductors.

7. The semiconductor device according to claim 6,
   wherein the control unit is configured to set a capacitance element of each of the second and third variable capacitance elements, in a manner that a series resonance circuit is configured with the second and third variable capacitance elements coupled between the primary inductor corresponding to the selected low noise amplifier and a non-corresponding primary inductor not coupled to the selected, with the non-corresponding primary inductor at a predetermined frequency.

8. The semiconductor device according to claim 7, wherein the predetermined frequency is a self-resonance frequency of the non-corresponding primary inductor.

9. The semiconductor device according to claim 7, wherein the predetermined frequency is a frequency of an interference wave input to the selected low noise amplifier.

10. The semiconductor device according to claim 2, wherein received signals of different frequency bands are selectively input between differential input nodes of the low noise amplifiers.

11. A semiconductor device comprising:
a plurality of primary inductors;
a secondary inductor which is provided commonly for the primary inductors, and magnetically coupled to each of primary inductors;
a demodulator which converts a signal transmitted from one of the primary inductors to the secondary inductor by electromagnetic induction, into a signal of a low frequency; and
a low noise amplifier which includes differential input nodes coupled to the output of the secondary inductor and differential output nodes coupled to the input of the demodulator.

12. The semiconductor device according to claim 11, wherein the low noise amplifier includes a gate ground amplifier circuit having one end coupled to a load inductor and other end coupled to the secondary inductor.

13. The semiconductor device according to claim 12, further comprising:
a plurality of first variable capacitance elements which respectively correspond to the first primary inductors, and are parallelly coupled to their corresponding primary inductors, and
a second variable capacitance element which is parallelly coupled to the load inductor.

14. The semiconductor device according to claim 13, wherein the semiconductor device further includes a control unit,
wherein, when a received signal is input to one of the primary inductors, the control unit is configured to set a capacitance value of a corresponding first variable element, in a manner that a parallel resonance circuit is configured with the primary inductor with the received signal input thereto and the corresponding first variable capacitance element at a frequency of the received signal, and to set a capacitance value of the second variable capacitance element, in a manner that a parallel resonance circuit is configured with the load inductor and the second variable capacitance element at the frequency of the received signal.

15. A semiconductor device comprising:
a plurality of low noise amplifiers to which received signals of different frequency bands are selectively input;
a plurality of primary inductors which are coupled between differential output nodes of the low noise amplifiers, and
a secondary inductor which is provided commonly for the primary inductors, and magnetically coupled to the primary inductors.

* * * * *